United States Patent
Kim et al.

(10) Patent No.: US 12,300,767 B2
(45) Date of Patent: May 13, 2025

(54) DISPLAY APPARATUS USING MICRO LED AND METHOD FOR MANUFACTURING SAME

(71) Applicant: LG ELECTRONICS INC., Seoul (KR)

(72) Inventors: Jeomoh Kim, Seoul (KR); Younghak Chang, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 466 days.

(21) Appl. No.: 17/770,934

(22) PCT Filed: Oct. 23, 2019

(86) PCT No.: PCT/KR2019/013948
§ 371 (c)(1),
(2) Date: Apr. 21, 2022

(87) PCT Pub. No.: WO2021/080030
PCT Pub. Date: Apr. 29, 2021

(65) Prior Publication Data
US 2022/0376141 A1    Nov. 24, 2022

(30) Foreign Application Priority Data

Oct. 22, 2019 (KR) ......................... 10-2019-0131654

(51) Int. Cl.
*H01L 33/38* (2010.01)
*H01L 25/075* (2006.01)
(Continued)

(52) U.S. Cl.
CPC ..... *H10H 20/8312* (2025.01); *H01L 25/0753* (2013.01); *H10H 20/018* (2025.01); *H10H 20/032* (2025.01)

(58) Field of Classification Search
CPC .............. H01L 33/382; H01L 25/0753; H01L 33/0093; H01L 2933/0016; H01L 33/38;
(Continued)

(56) References Cited

U.S. PATENT DOCUMENTS 6,100,103 A * 8/2000 Shim ..................... H01L 27/15
438/455
9,450,147 B2  9/2016 McGroddy et al.
(Continued)

FOREIGN PATENT DOCUMENTS

EP    3 998 634 A1    5/2022
EP    4 044 234 A1    8/2022
(Continued)

*Primary Examiner* — Karen Kusumakar
*Assistant Examiner* — Shawn Shaw Muslim
(74) *Attorney, Agent, or Firm* — Birch, Stewart, Kolasch & Birch, LLP

(57) ABSTRACT

The present specification provides a red semiconductor light emitting element having no residual bonding layer when a semiconductor light emitting element is selectively transferred or assembled, and a method for manufacturing a display apparatus using same. The method for manufacturing the display apparatus according to an embodiment of the present disclosure comprises the steps of: forming an epitaxial layer for implementing a red semiconductor light emitting element on a growth substrate; transferring the epitaxial layer on the growth substrate onto a first temporary substrate; forming a release layer on the epitaxial layer which has been transferred onto the first temporary substrate; transferring the epitaxial layer, on which the release layer has been formed, onto a second temporary substrate; manufacturing an individual semiconductor light emitting element by etching the epitaxial layer transferred on the second temporary substrate; and separating the semiconductor light emitting element from the second temporary substrate.

20 Claims, 23 Drawing Sheets

(51) Int. Cl.
*H10H 20/01* (2025.01)
*H10H 20/831* (2025.01)

(58) Field of Classification Search
CPC . H01L 33/46; H01L 33/62; H01L 2933/0025; H01L 2933/0066; H01L 33/0095; H01L 33/44; H01L 25/167; H01L 27/156; H01L 33/0045; H01L 2224/0344
See application file for complete search history.

(56) References Cited

U.S. PATENT DOCUMENTS

| | | | | |
|---|---|---|---|---|
| 2006/0055014 | A1* | 3/2006 | Tsurume | H01L 23/58 257/E23.138 |
| 2010/0096640 | A1* | 4/2010 | Kim | H01L 31/18 257/E33.056 |
| 2012/0175591 | A1 | 7/2012 | Yim | |
| 2012/0235189 | A1* | 9/2012 | Hsu | H01L 33/02 257/98 |
| 2014/0147987 | A1* | 5/2014 | Zhao | H01L 21/76256 438/458 |
| 2020/0068726 | A1* | 2/2020 | Hwang | H05K 5/0221 |
| 2020/0083415 | A1 | 3/2020 | Kim et al. | |

FOREIGN PATENT DOCUMENTS

| | | |
|---|---|---|
| JP | 2010-177390 A | 8/2010 |
| KR | 10-2003-0007208 A | 1/2003 |
| KR | 10-2010-0059174 A | 6/2010 |
| KR | 10-1210426 B1 | 12/2012 |
| KR | 10-2014-0057249 A | 5/2014 |
| KR | 10-2019-0029343 A | 3/2019 |
| KR | 10-2019-0076929 A | 7/2019 |
| KR | 10-2019-0088929 A | 7/2019 |
| KR | 10-2019-0117413 A | 10/2019 |
| WO | WO 2017/142315 A1 | 8/2017 |

* cited by examiner

DISPLAY APPARATUS USING MICRO LED AND METHOD FOR MANUFACTURING SAME

CROSS REFERENCE TO RELATED APPLICATIONS

This application is the National Stage filing under 35 U.S.C. 371 of International Application No. PCT/KR2019/013948, filed on Oct. 23, 2019, which claims the benefit of earlier filing date and right of priority to Korean Application No. 10-2019-0131654, filed on Oct. 22, 2019, the contents of all these applications are hereby incorporated by reference herein in their entirety.

TECHNICAL FIELD

The present disclosure relates to technology related to a display device, and more particularly to a method for manufacturing a display device using a micro-light emitting diode (micro-LED) and a substrate used in manufacturing the display device.

BACKGROUND ART

Recently, in a field of a display technology, display devices having excellent characteristics such as thinness, flexibility, and the like have been developed. On the other hand, currently commercialized major displays are represented by a LCD (liquid crystal display) and an OLED (organic light emitting diode).

However, the LCD has a response time that is not fast, and is difficult to be flexibly implemented.

On the other hand, LED (light emitting diode), which is a well-known semiconductor light-emitting element that converts electric current into light, has been used as a light source for a display image of an electronic device including an information and communication device along with a GaP:N-based green LED, starting with commercialization of a red LED using a GaAsP compound semiconductor in 1962. Accordingly, a method for solving the above-described problems by implementing a display using the semiconductor light-emitting element may be proposed. Such light emitting diode has various advantages, such as long lifespan, low power consumption, excellent initial driving characteristics, high vibration resistance, and the like, compared to a filament-based light-emitting element.

In order to implement a display device using these semiconductor light emitting elements, a very large number of semiconductor light emitting elements is required. Therefore, considering manufacturing cost, the size of the individual semiconductor light emitting elements should be reduced so as to increase the number of semiconductor light emitting elements produced on a substrate having a given area.

Further, one unit pixel is implemented through a combination of a plurality of semiconductor light emitting elements configured to emit light of different colors, the semiconductor light emitting element configured to emit light of each color may be selectively separated from a growth substrate, and may be transferred onto a wiring substrate.

However, red semiconductor light emitting elements are formed on an optically opaque GaAs substrate and, in order to selectively transfer the red semiconductor light emitting element, the red semiconductor light emitting element is first transferred onto a temporary substrate provided with a bonding layer formed thereon, and thereafter, a selective retransfer process is performed. The remainder of the bonding layer is located under the semiconductor light emitting element selectively transferred during the retransfer process, and thereby, a limitation on miniaturization of the element may occur.

The present disclosure suggests a red semiconductor light emitting element having no residual bonding layer when the red semiconductor light emitting element is selectively transferred, and a display device using the same.

DISCLOSURE

Technical Task

An object of an embodiment of the present disclosure is to provide a display device and a method for manufacturing the same using a semiconductor light emitting element.

Another object of an embodiment of the present disclosure is to provide a red semiconductor light emitting element having no residual bonding layer when the red semiconductor light emitting element is selectively transferred, and a display device using the same.

Further, yet another object of an embodiment of the present disclosure is to solve various problems not mentioned herein. Those skilled in the art will appreciate the embodiments of the present disclosure through the description and drawings to be described later.

Technical Solutions

In order to accomplish the above and other tasks, a method for manufacturing a display device using a semiconductor light emitting element according to one aspect of the present disclosure includes forming an epitaxial layer configured to implement a red semiconductor light emitting element on a growth substrate, transferring the epitaxial layer on the growth substrate onto a first temporary substrate, forming a release layer on the epitaxial layer transferred onto the first temporary substrate, transferring the epitaxial layer provided with the release layer formed thereon onto a second temporary substrate, manufacturing an individual semiconductor light emitting element by etching the epitaxial layer transferred onto the second temporary substrate, and separating the semiconductor light emitting element from the second temporary substrate.

The method may further include, before the separating the semiconductor light emitting element from the second temporary substrate, forming a passivation layer configured to surround upper and side surfaces of the individual light emitting element.

The transferring of epitaxial layer onto the second temporary substrate may include bringing a bonding layer formed on the second temporary substrate into contact with the release layer.

The second temporary substrate may be formed of a light transmitting material, and the separating of the semiconductor light emitting element from the second temporary substrate may include a Laser Lift-Off (LLO) process.

The release layer may be located on a lower surface of the separated semiconductor light emitting element.

The release layer may be a metal layer or an inorganic insulating layer.

The release layer may have a thickness of 0.01 µm to 1 µm.

The release layer may include a stack structure including a first metal layer, an oxide layer and a second metal layer, and the separating the semiconductor light emitting element from the second temporary substrate may include causing interfacial separation between the first metal layer and the oxide layer of the release layer.

The manufacturing of the individual semiconductor light emitting element may include forming a plurality of conductivity-type electrodes on one surface of the etched epitaxial layer.

The bonding layer may include benzocyclobutene (BCB).

The transferring of the epitaxial layer onto the first temporary substrate may include forming a sacrificial layer on an upper surface of the epitaxial layer, and bringing the bonding layer formed on the first temporary substrate into contact with the sacrificial layer.

The method may further include self-assembling the separated semiconductor light emitting element with a substrate using an electric field and a magnetic field.

A display device including a plurality of semiconductor light emitting elements configured to emit light of different colors according to another aspect of the present disclosure is provided, wherein, among the plurality of semiconductor light emitting elements, a semiconductor light emitting element configured to emit red light includes a first conductivity-type semiconductor layer, a second conductivity-type semiconductor layer located on the first conductivity-type semiconductor layer, an active layer disposed between the first conductivity-type semiconductor layer and the second conductivity-type semiconductor layer, a second conductivity-type electrode located on the second conductivity-type semiconductor layer, a first conductivity-type electrode located on an exposed region of the first conductivity-type semiconductor layer, formed by etching a part of each of the second conductivity-type semiconductor layer and the active layer, a first passivation layer configured to surround upper and side surfaces of the semiconductor light emitting layer, and a second passivation layer located on a lower surface of the semiconductor light emitting element.

The first passivation layer may be an inorganic insulating layer, and the second passivation layer may be a metal layer.

Advantageous Effects

According to one embodiment of the present disclosure, it is possible to provide a display device and a method for manufacturing the same using a semiconductor light emitting element.

Specifically, when a red semiconductor light emitting element is manufactured, an epitaxial layer is formed on a growth substrate, and a release layer is formed on the lower surface of the epitaxial layer through a transfer process. Therefore, a semiconductor light emitting element including the release layer is manufactured through an etching process. The release layer may serve as a passivation layer, and may prevent the bonding layer from remaining during a selective transfer process of the semiconductor light emitting element.

In addition, damage to the semiconductor light emitting element generated during the selective transfer process may be minimized.

Further, when a metal layer is used as the release layer, the metal layer may serve as a reflective layer, and may thus improve the light extraction effect of the semiconductor light emitting element.

Furthermore, according to another embodiment of the present disclosure, additional effects not mentioned herein may be exhibited. Those of ordinary skill in the art may understand them through the full text of the specification and drawings.

BEST MODE FOR DISCLOSURE

Reference will now be made in detail to embodiments of the present disclosure, examples of which are illustrated in the accompanying drawings. Wherever possible, the same reference numbers will be used throughout the drawings to refer to the same or like parts, and redundant description thereof will be omitted. As used herein, the suffixes "module" and "unit" are added or used interchangeably to facilitate preparation of this specification and are not intended to suggest distinct meanings or functions. In describing embodiments disclosed in this specification, relevant well-known technologies may not be described in detail in order not to obscure the subject matter of the embodiments disclosed in this specification. In addition, it should be noted that the accompanying drawings are only for easy understanding of the embodiments disclosed in the present specification, and should not be construed as limiting the technical spirit disclosed in the present specification.

Furthermore, although the drawings are separately described for simplicity, embodiments implemented by combining at least two or more drawings are also within the scope of the present disclosure.

In addition, when an element such as a layer, region or module is described as being "on" another element, it is to be understood that the element may be directly on the other element or there may be an intermediate element between them.

The display device described herein is a concept including all display devices that display information with a unit pixel or a set of unit pixels. Therefore, the display device may be applied not only to finished products but also to parts. For example, a panel corresponding to a part of a digital TV also independently corresponds to the display device in the present specification. The finished products include a mobile phone, a smartphone, a laptop, a digital broadcasting terminal, a personal digital assistant (PDA), a portable multimedia player (PMP), a navigation system, a slate PC, a tablet, an Ultrabook, a digital TV, a desktop computer, and the like.

However, it will be readily apparent to those skilled in the art that the configuration according to the embodiments described herein is applicable even to a new product that will be developed later as a display device.

In addition, the semiconductor light emitting element mentioned in this specification is a concept including an LED, a micro LED, and the like, and may be used interchangeably therewith.

Figure 1:
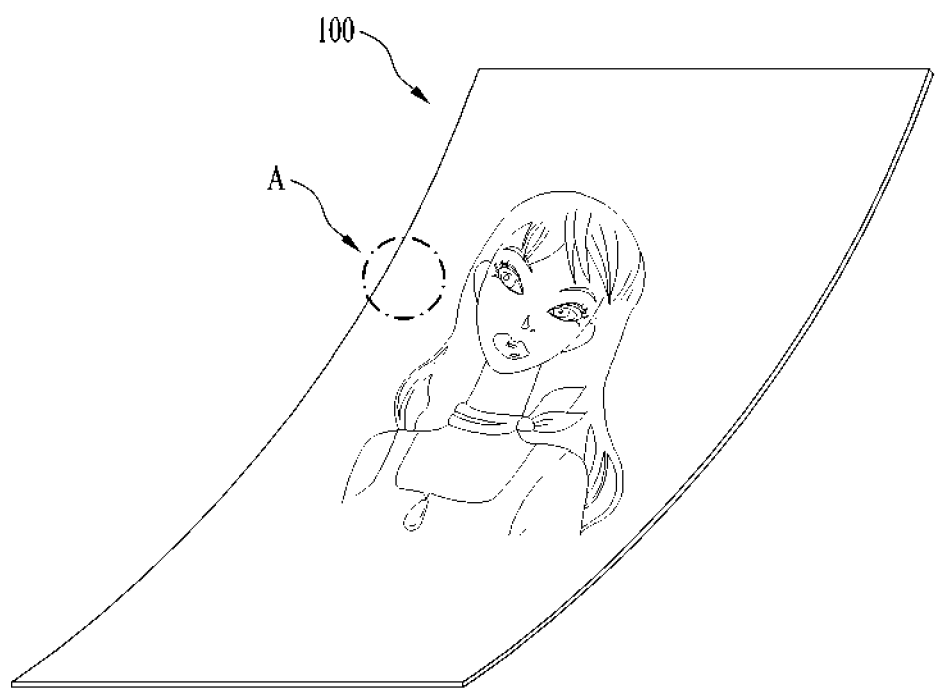
FIG. 1 is a conceptual diagram illustrating an embodiment of a display device using a semiconductor light emitting element according to the present disclosure.

FIG. 1 is a conceptual view illustrating an embodiment of a display device using a semiconductor light emitting element according to the present disclosure.

As shown in FIG. 1, information processed by a controller (not shown) of a display device 100 may be displayed using a flexible display.

The flexible display may include, for example, a display that can be warped, bent, twisted, folded, or rolled by external force.

Furthermore, the flexible display may be, for example, a display manufactured on a thin and flexible substrate that can be warped, bent, folded, or rolled like paper while maintaining the display characteristics of a conventional flat panel display.

When the flexible display remains in an unbent state (e.g., a state having an infinite radius of curvature) (hereinafter referred to as a first state), the display area of the flexible display forms a flat surface. When the display in the first state is changed to a bent state (e.g., a state having a finite radius of curvature) (hereinafter referred to as a second state) by external force, the display area may be a curved surface. As shown in FIG. 1, the information displayed in the second state may be visual information output on a curved surface. Such visual information may be implemented by independently controlling the light emission of sub-pixels arranged in a matrix form. The unit pixel may mean, for example, a minimum unit for implementing one color.

The unit pixel of the flexible display may be implemented by a semiconductor light emitting element. In the present disclosure, a light emitting diode (LED) is exemplified as a type of the semiconductor light emitting element configured to convert electric current into light. The LED may be formed in a small size, and may thus serve as a unit pixel even in the second state.

Hereinafter, a flexible display implemented using the LED will be described in more detail with reference to the drawings.

Figure 2:
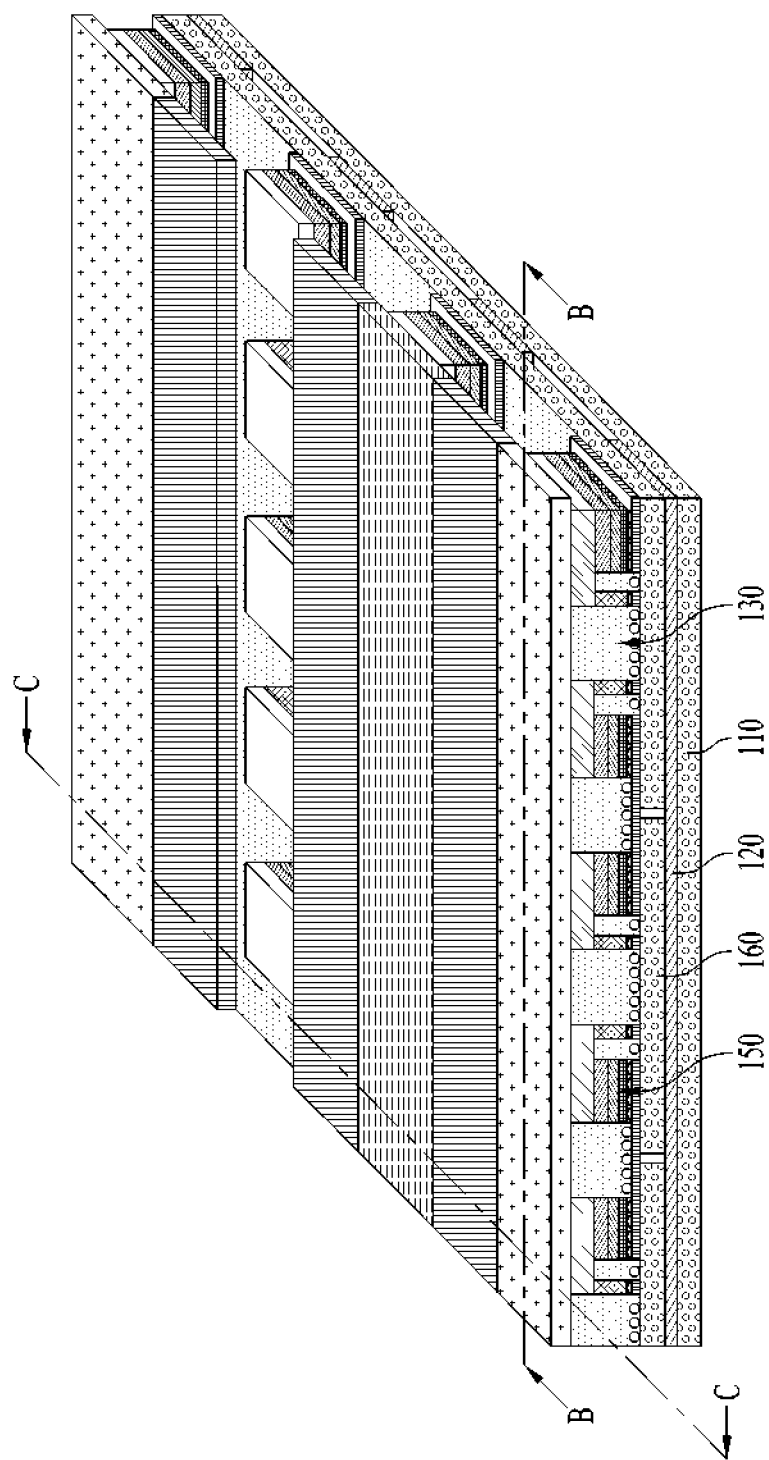
FIG. 2 is a partially enlarged diagram showing a part A shown in FIG. 1.

FIG. 2 is a partially enlarged view showing part A of FIG. 1.

Figure 3A:
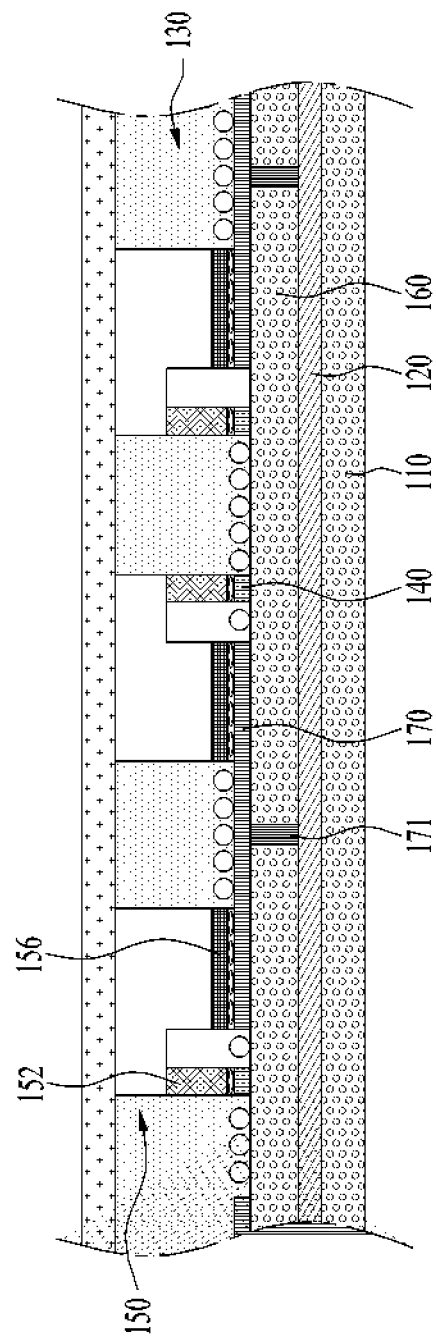
FIGS. 3A and 3B (also collectively referred to below as FIG. 3) are cross-sectional diagrams taken along the cutting lines B-B and C-C in FIG. 2, respectively.
Figure 3B:
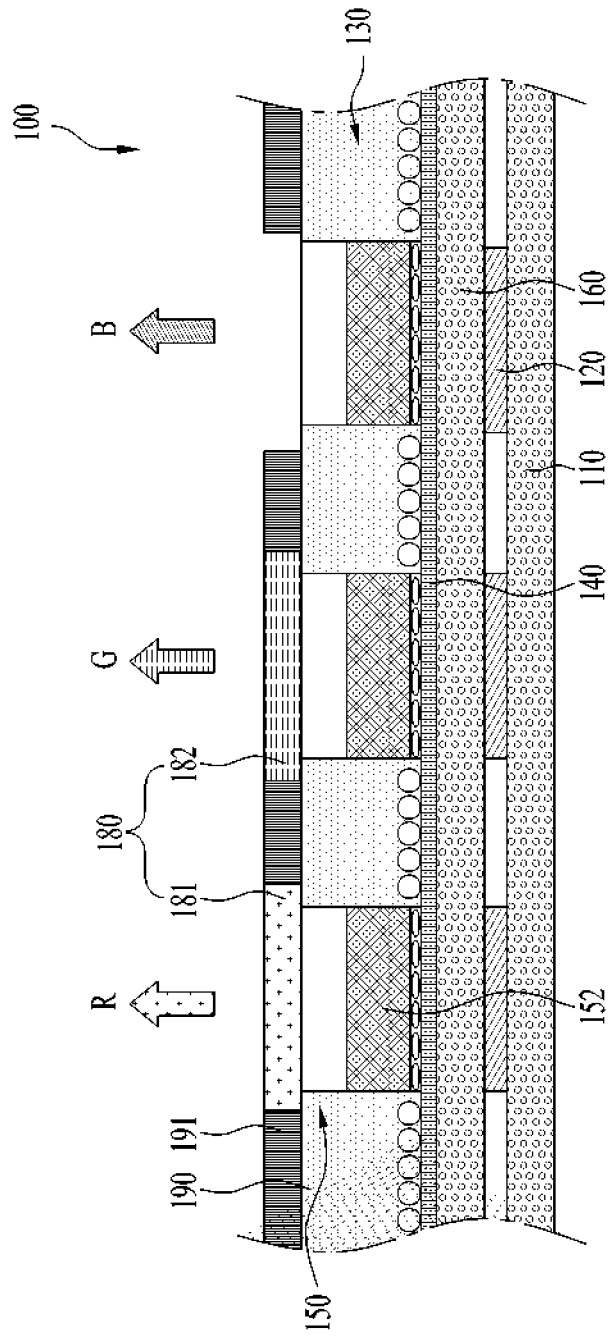

FIGS. 3A and 3B are cross-sectional views taken along lines B-B and C-C in FIG. 2.

Figure 4:
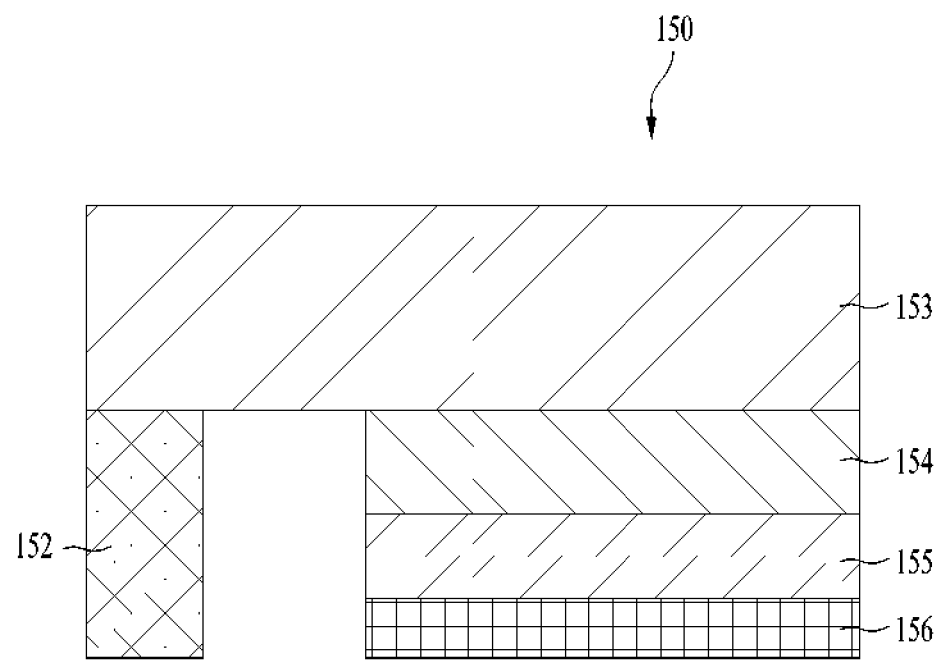
FIG. 4 is a conceptual diagram illustrating the flip-chip type semiconductor light emitting element of FIG. 3.

FIG. 4 is a conceptual view illustrating the flip-chip type semiconductor light emitting element of FIG. 3.

Figure 5A:
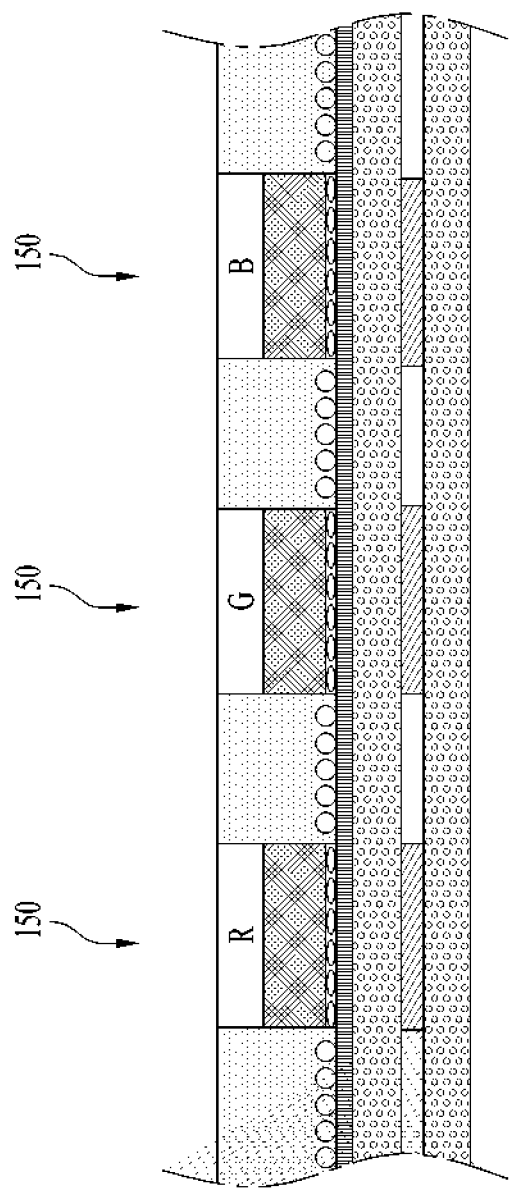
FIGS. 5A to 5C are conceptual diagrams illustrating various examples of color implementation with respect to a flip-chip type semiconductor light emitting element.
Figure 5B:
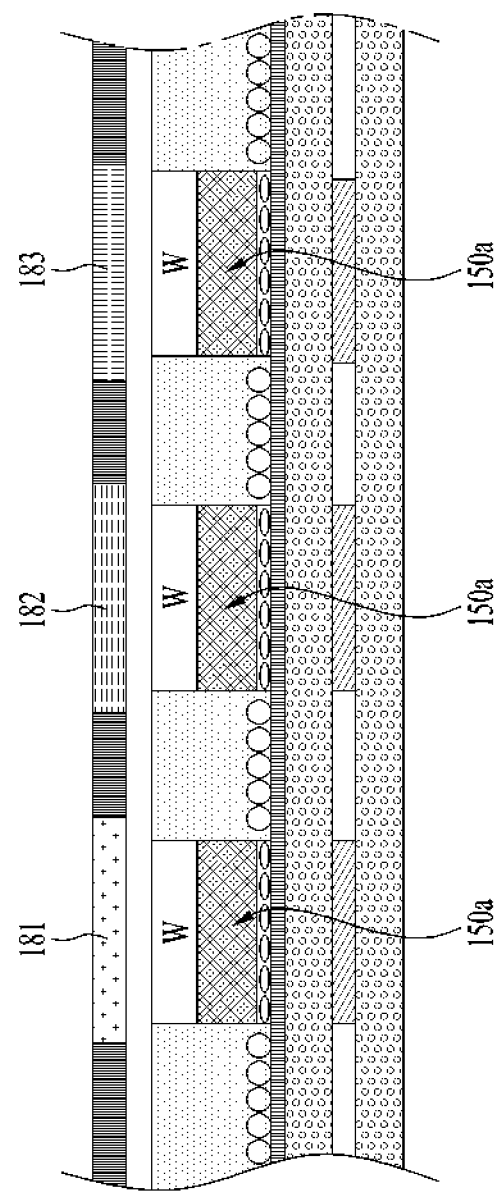
Figure 5C:
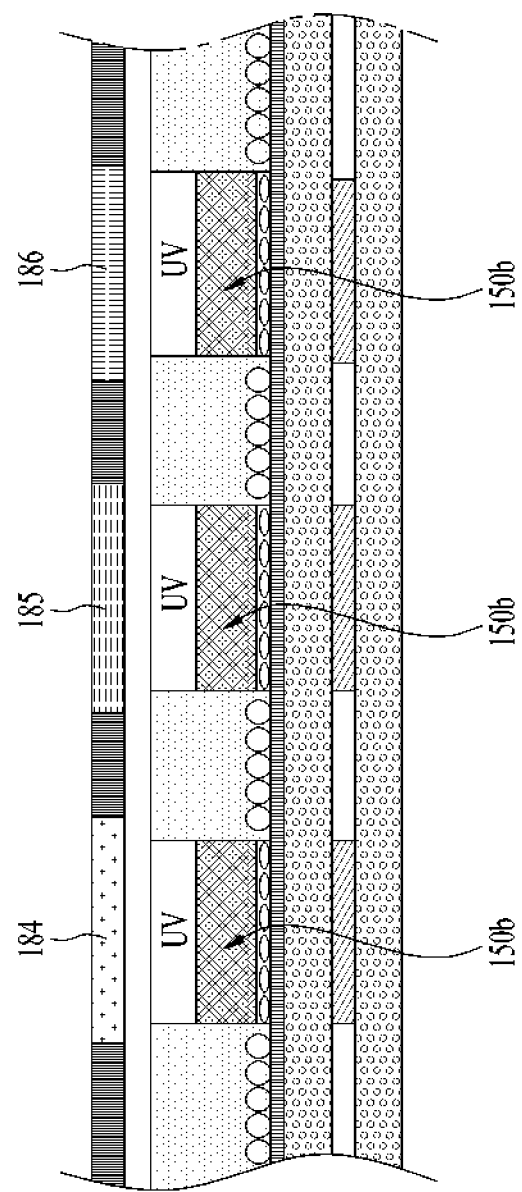

FIGS. 5A to 5C are conceptual views illustrating various examples of implementation of colors in relation to a flip-chip type semiconductor light emitting element.

As shown in FIGS. 2, 3A and 3B, the display device 100 using a passive matrix (PM) type semiconductor light emitting element is exemplified as the display device 100 using a semiconductor light emitting element. However, the examples described below are also applicable to an active matrix (AM) type semiconductor light emitting element.

The display device 100 shown in FIG. 1 may include a substrate 110, a first electrode 120, a conductive adhesive layer 130, a second electrode 140, and at least one semiconductor light emitting element 150, as shown in FIG. 2.

The substrate 110 may be a flexible substrate. For example, to implement a flexible display device, the substrate 110 may include glass or polyimide (PI). Any insulative and flexible material such as polyethylene naphthalate (PEN) or polyethylene terephthalate (PET) may be employed. In addition, the substrate 110 may be formed of either a transparent material or an opaque material.

The substrate 110 may be a wiring substrate on which the first electrode 120 is disposed. Thus, the first electrode 120 may be positioned on the substrate 110.

As shown in FIG. 3A, an insulating layer 160 may be disposed on the substrate 110 on which the first electrode 120 is positioned, and an auxiliary electrode 170 may be positioned on the insulating layer 160. In this case, a stack in which the insulating layer 160 is laminated on the substrate 110 may be a single wiring substrate. More specifically, the insulating layer 160 may be formed of an insulative and flexible material such as PI, PET, or PEN, and may be integrated with the substrate 110 to form a single substrate.

The auxiliary electrode 170, which is an electrode that electrically connects the first electrode 120 and the semiconductor light emitting element 150, is positioned on the insulating layer 160, and is disposed to correspond to the position of the first electrode 120. For example, the auxiliary electrode 170 may have a dot shape and may be electrically connected to the first electrode 120 by an electrode hole 171 formed through the insulating layer 160. The electrode hole 171 may be formed by filling a via hole with a conductive material.

As shown in FIG. 2 or 3A, a conductive adhesive layer 130 may be formed on one surface of the insulating layer 160, but embodiments of the present disclosure are not limited thereto. For example, a layer performing a specific function may be formed between the insulating layer 160 and the conductive adhesive layer 130, or the conductive adhesive layer 130 may be disposed on the substrate 110 without the insulating layer 160. In a structure in which the conductive adhesive layer 130 is disposed on the substrate 110, the conductive adhesive layer 130 may serve as an insulating layer.

The conductive adhesive layer 130 may be a layer having adhesiveness and conductivity. For this purpose, a material having conductivity and a material having adhesiveness may be mixed in the conductive adhesive layer 130. In addition, the conductive adhesive layer 130 may have ductility, thereby providing making the display device flexible.

As an example, the conductive adhesive layer 130 may be an anisotropic conductive film (ACF), an anisotropic conductive paste, a solution containing conductive particles, or the like. The conductive adhesive layer 130 may be configured as a layer that allows electrical interconnection in the direction of the Z-axis extending through the thickness, but is electrically insulative in the horizontal X-Y direction. Accordingly, the conductive adhesive layer 130 may be referred to as a Z-axis conductive layer (hereinafter, referred to simply as a "conductive adhesive layer").

The ACF is a film in which an anisotropic conductive medium is mixed with an insulating base member. When the ACF is subjected to heat and pressure, only a specific portion thereof becomes conductive by the anisotropic conductive medium. Hereinafter, it will be described that heat and pressure are applied to the ACF. However, another method may be used to make the ACF partially conductive. The other method may be, for example, application of only one of the heat and pressure or UV curing.

In addition, the anisotropic conductive medium may be, for example, conductive balls or conductive particles. For example, the ACF may be a film in which conductive balls are mixed with an insulating base member. Thus, when heat and pressure are applied to the ACF, only a specific portion of the ACF is allowed to be conductive by the conductive balls. The ACF may contain a plurality of particles formed by coating the core of a conductive material with an insulating film made of a polymer material. In this case, as the insulating film is destroyed in a portion to which heat and pressure are applied, the portion is made to be conductive by the core. At this time, the cores may be deformed to form layers that contact each other in the thickness direction of the film. As a more specific example, heat and pressure are applied to the whole ACF, and an electrical connection in the Z-axis direction is partially formed by the height difference of a counterpart adhered by the ACF.

As another example, the ACF may contain a plurality of particles formed by coating an insulating core with a conductive material. In this case, as the conductive material is deformed (pressed) in a portion to which heat and pressure are applied, the portion is made to be conductive in the thickness direction of the film. As another example, the conductive material may be disposed through the insulating base member in the Z-axis direction to provide conductivity in the thickness direction of the film. In this case, the conductive material may have a pointed end.

The ACF may be a fixed array ACF in which conductive balls are inserted into one surface of the insulating base member. More specifically, the insulating base member may be formed of an adhesive material, and the conductive balls may be intensively disposed on the bottom portion of the insulating base member. Thus, when the base member is subjected to heat and pressure, it may be deformed together with the conductive balls, exhibiting conductivity in the vertical direction.

However, the present disclosure is not necessarily limited thereto, and the ACF may be formed by randomly mixing conductive balls in the insulating base member, or may be composed of a plurality of layers with conductive balls arranged on one of the layers (as a double-ACF).

The anisotropic conductive paste may be a combination of a paste and conductive balls, and may be a paste in which conductive balls are mixed with an insulating and adhesive base material. Also, the solution containing conductive particles may be a solution containing any conductive particles or nanoparticles.

Referring back to FIG. 3A, the second electrode 140 is positioned on the insulating layer 160 and spaced apart from the auxiliary electrode 170. That is, the conductive adhesive layer 130 is disposed on the insulating layer 160 having the auxiliary electrode 170 and the second electrode 140 positioned thereon.

After the conductive adhesive layer 130 is formed with the auxiliary electrode 170 and the second electrode 140 positioned on the insulating layer 160, the semiconductor light emitting element 150 is connected thereto in a flip-chip form by applying heat and pressure. Thereby, the semiconductor light emitting element 150 is electrically connected to the first electrode 120 and the second electrode 140.

Referring to FIG. 4, the semiconductor light emitting element may be a flip chip-type light emitting device.

For example, the semiconductor light emitting element may include a p-type electrode 156, a p-type semiconductor layer 155 on which the p-type electrode 156 is formed, an active layer 154 formed on the p-type semiconductor layer 155, an n-type semiconductor layer 153 formed on the active layer 154, and an n-type electrode 152 disposed on the n-type semiconductor layer 153 and horizontally spaced apart from the p-type electrode 156. In this case, the p-type electrode 156 may be electrically connected to the auxiliary electrode 170, which is shown in FIG. 3, by the conductive adhesive layer 130, and the n-type electrode 152 may be electrically connected to the second electrode 140.

Referring back to FIGS. 2, 3A and 3B, the auxiliary electrode 170 may be elongated in one direction. Thus, one auxiliary electrode may be electrically connected to the plurality of semiconductor light emitting elements 150. For example, p-type electrodes of semiconductor light emitting elements on left and right sides of an auxiliary electrode may be electrically connected to one auxiliary electrode.

More specifically, the semiconductor light emitting element 150 may be press-fitted into the conductive adhesive layer 130 by heat and pressure. Thereby, only the portions of the semiconductor light emitting element 150 between the p-type electrode 156 and the auxiliary electrode 170 and between the n-type electrode 152 and the second electrode 140 may exhibit conductivity, and the other portions of the semiconductor light emitting element 150 do not exhibit conductivity as they are not press-fitted. In this way, the conductive adhesive layer 130 interconnects and electrically connects the semiconductor light emitting element 150 and the auxiliary electrode 170 and interconnects and electrically connects the semiconductor light emitting element 150 and the second electrode 140.

The plurality of semiconductor light emitting elements 150 may constitute a light emitting device array, and a phosphor conversion layer 180 may be formed on the light emitting device array.

The light emitting device array may include a plurality of semiconductor light emitting elements having different luminance values. Each semiconductor light emitting element 150 may constitute a unit pixel and may be electrically connected to the first electrode 120. For example, a plurality of first electrodes 120 may be provided, and the semiconductor light emitting elements may be arranged in, for example, several columns. The semiconductor light emitting elements in each column may be electrically connected to any one of the plurality of first electrodes.

In addition, since the semiconductor light emitting elements are connected in a flip-chip form, semiconductor light emitting elements grown on a transparent dielectric substrate may be used. The semiconductor light emitting elements may be, for example, nitride semiconductor light emitting elements. Since the semiconductor light emitting element 150 has excellent luminance, it may constitute an individual unit pixel even when it has a small size.

As shown in FIG. 3, a partition wall 190 may be formed between the semiconductor light emitting elements 150. In this case, the partition wall 190 may serve to separate individual unit pixels from each other, and may be integrated with the conductive adhesive layer 130. For example, by inserting the semiconductor light emitting element 150 into the ACF, the base member of the ACF may form the partition wall.

In addition, when the base member of the ACF is black, the partition wall 190 may have reflectance and increase contrast even without a separate black insulator.

As another example, a reflective partition wall may be separately provided as the partition wall 190. In this case, the partition wall 190 may include a black or white insulator depending on the purpose of the display device. When a partition wall including a white insulator is used, reflectivity may be increased. When a partition wall including a black insulator is used, it may have reflectance and increase contrast.

The phosphor conversion layer 180 may be positioned on the outer surface of the semiconductor light emitting element 150. For example, the semiconductor light emitting element 150 may be a blue semiconductor light emitting element that emits blue (B) light, and the phosphor conversion layer 180 may function to convert the blue (B) light into a color of a unit pixel. The phosphor conversion layer 180 may be a red phosphor 181 or a green phosphor 182 constituting an individual pixel.

That is, the red phosphor 181 capable of converting blue light into red (R) light may be laminated on a blue semiconductor light emitting element at a position of a unit pixel of red color, and the green phosphor 182 capable of converting blue light into green (G) light may be laminated on the blue semiconductor light emitting element at a position of a unit pixel of green color. Only the blue semiconductor light emitting element may be used alone in the portion constituting the unit pixel of blue color. In this case, unit pixels of red (R), green (G), and blue (B) may constitute one pixel. More specifically, a phosphor of one color may be laminated along each line of the first electrode 120. Accordingly, one line on the first electrode 120 may be an electrode for controlling one color. That is, red (R), green (G), and blue (B) may be sequentially disposed along the second electrode 140, thereby implementing a unit pixel.

However, embodiments of the present disclosure are not limited thereto. Unit pixels of red (R), green (G), and blue (B) may be implemented by combining the semiconductor light emitting element 150 and the quantum dot (QD) rather than using the phosphor.

Also, a black matrix 191 may be disposed between the phosphor conversion layers to improve contrast. That is, the black matrix 191 may improve contrast of light and darkness.

However, embodiments of the present disclosure are not limited thereto, and anther structure may be applied to implement blue, red, and green colors.

Referring to FIG. 5A, each semiconductor light emitting element may be implemented as a high-power light emitting device emitting light of various colors including blue by using gallium nitride (GaN) as a main material and adding indium (In) and/or aluminum (Al).

In this case, each semiconductor light emitting element may be a red, green, or blue semiconductor light emitting element to form a unit pixel (sub-pixel). For example, red, green, and blue semiconductor light emitting elements R, G, and B may be alternately disposed, and unit pixels of red, green, and blue may constitute one pixel by the red, green and blue semiconductor light emitting elements. Thereby, a full-color display may be implemented.

Referring to FIG. 5B, the semiconductor light emitting element 150a may include a white light emitting device W having a yellow phosphor conversion layer, which is provided for each device. In this case, in order to form a unit pixel, a red phosphor conversion layer 181, a green phosphor conversion layer 182, and a blue phosphor conversion layer 183 may be disposed on the white light emitting device W. In addition, a unit pixel may be formed using a color filter repeating red, green, and blue on the white light emitting device W.

Referring to FIG. 5C, a red phosphor conversion layer 184, a green phosphor conversion layer 185, and a blue phosphor conversion layer 186 may be provided on a on an ultraviolet light emitting device. Not only visible light but also ultraviolet (UV) light may be used in the entire region of the semiconductor light emitting element. In an embodiment, UV may be used as an excitation source of the upper phosphor in the semiconductor light emitting element.

Referring back to this example, the semiconductor light emitting element is positioned on the conductive adhesive layer to constitute a unit pixel in the display device. Since the semiconductor light emitting element has excellent luminance, individual unit pixels may be configured despite even when the semiconductor light emitting element has a small size.

Regarding the size of such an individual semiconductor light emitting element, the length of each side of the device may be, for example, 80 µm or less, and the device may have a rectangular or square shape. When the semiconductor light emitting element has a rectangular shape, the size thereof may be less than or equal to 20 µm×80 µm.

In addition, even when a square semiconductor light emitting element having a side length of 10 µm is used as a unit pixel, sufficient brightness to form a display device may be obtained.

Therefore, for example, in case of a rectangular pixel having a unit pixel size of 600 µm×300 µm (i.e., one side by the other side), a distance of a semiconductor light emitting element becomes sufficiently long relatively.

Thus, in this case, it is able to implement a flexible display device having high image quality over HD image quality.

The above-described display device using the semiconductor light emitting element may be prepared by a new fabricating method. Such a fabricating method will be described with reference to FIG. 6 as follows.

Figure 6:
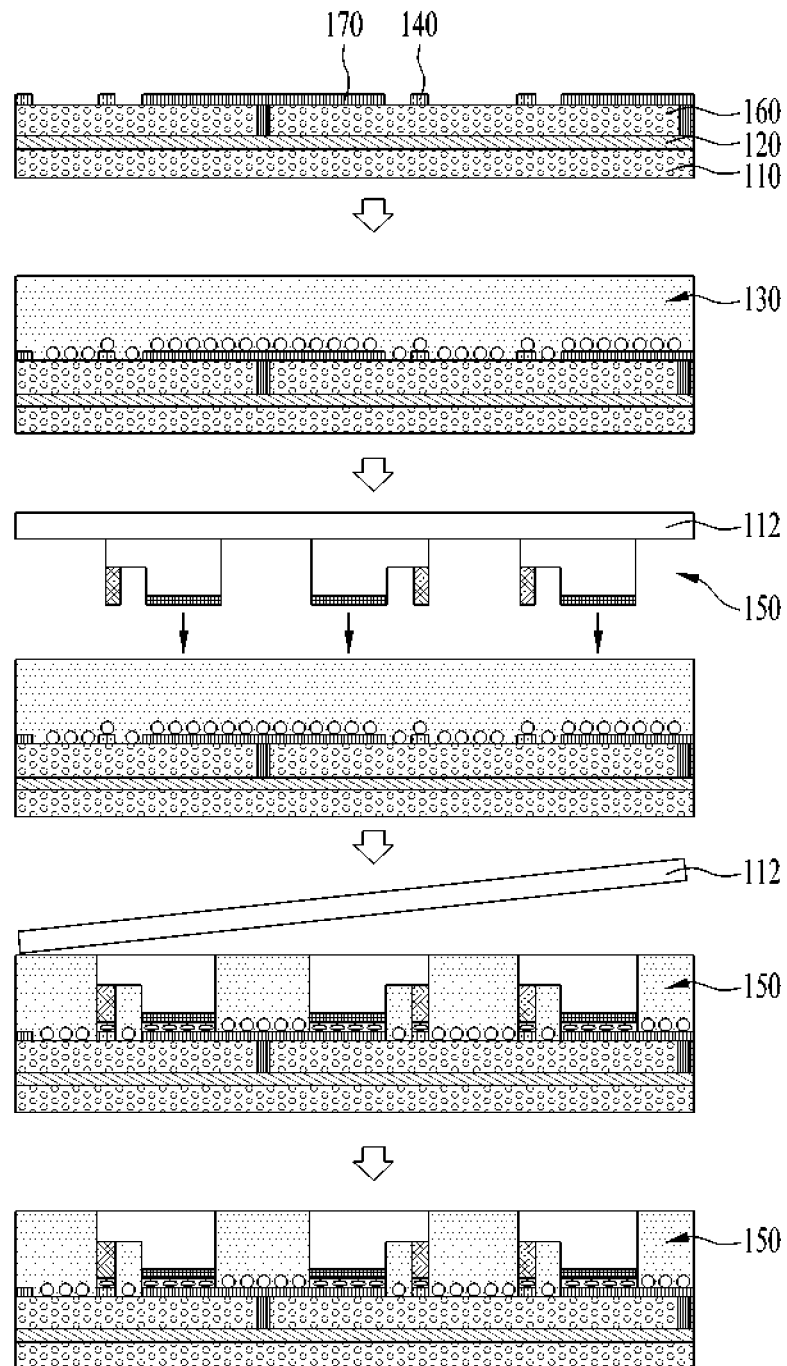
FIG. 6 shows cross-sectional views of a method of fabricating a display device using a semiconductor light emitting element according to the present disclosure.

FIG. 6 shows cross-sectional views of a method of fabricating a display device using a semiconductor light emitting element according to the present disclosure.

Referring to FIG. 6, first of all, a conductive adhesive layer 130 is formed on an insulating layer 160 located between an auxiliary electrode 170 and a second electrode 140. The insulating layer 160 is tacked on a wiring substrate 110. On the wiring substrate 110, a first electrode 120, the auxiliary electrode 170 and the second electrode 140 are disposed. In this case, the first electrode 120 and the second electrode 140 may be disposed in mutually orthogonal directions, respectively. In order to implement a flexible display device, the wiring substrate 110 and the insulating layer 160 may include glass or polyimide (PI) each.

For example, the conductive adhesive layer 130 may be implemented by an anisotropic conductive film. To this end, an anisotropic conductive film may be coated on the substrate on which the insulating layer 160 is located.

Subsequently, a temporary substrate 112, on which a plurality of semiconductor light emitting elements 150 configuring individual pixels are located to correspond to locations of the auxiliary electrode 170 and the second electrodes 140, is disposed in a manner that the semiconductor light emitting element 150 confronts the auxiliary electrode 170 and the second electrode 140.

In this regard, the temporary 112 substrate 112 is a growing substrate for growing the semiconductor light emitting element 150 and may include a sapphire or silicon substrate.

The semiconductor light emitting element is configured to have a space and size for configuring a display device when formed in unit of wafer, thereby being effectively used for the display device.

Subsequently, the wiring substrate 110 and the temporary substrate 112 are thermally compressed together. By the thermocompression, the wiring substrate 110 and the temporary substrate 112 are bonded together. Owing to the property of an anisotropic conductive film having conductivity by thermocompression, only a portion among the semiconductor light emitting element 150, the auxiliary electrode 170 and the second electrode 140 has conductivity, via which the electrodes and the semiconductor light emitting element 150 may be connected electrically. In this case, the semiconductor light emitting element 150 is inserted into the anisotropic conductive film, by which a partition may be formed between the semiconductor light emitting elements 150.

Then the temporary substrate 112 is removed. For example, the temporary substrate 112 may be removed using Laser Lift-Off (LLO) or Chemical Lift-Off (CLO).

Finally, by removing the temporary substrate 112, the semiconductor light emitting elements 150 exposed externally. If necessary, the wiring substrate 110 to which the semiconductor light emitting elements 150 are coupled may be coated with silicon oxide (SiOx) or the like to form a transparent insulating layer (not shown).

In addition, a step of forming a phosphor layer on one side of the semiconductor light emitting element 150 may be further included. For example, the semiconductor light emitting element 150 may include a blue semiconductor light emitting element emitting Blue (B) light, and a red or green phosphor for converting the blue (B) light into a color of a unit pixel may form a layer on one side of the blue semiconductor light emitting element.

The above-described fabricating method or structure of the display device using the semiconductor light emitting element may be modified into various forms. For example, the above-described display device may employ a vertical semiconductor light emitting element.

Furthermore, a modification or embodiment described in the following may use the same or similar reference numbers for the same or similar configurations of the former example and the former description may apply thereto.

Figure 7:
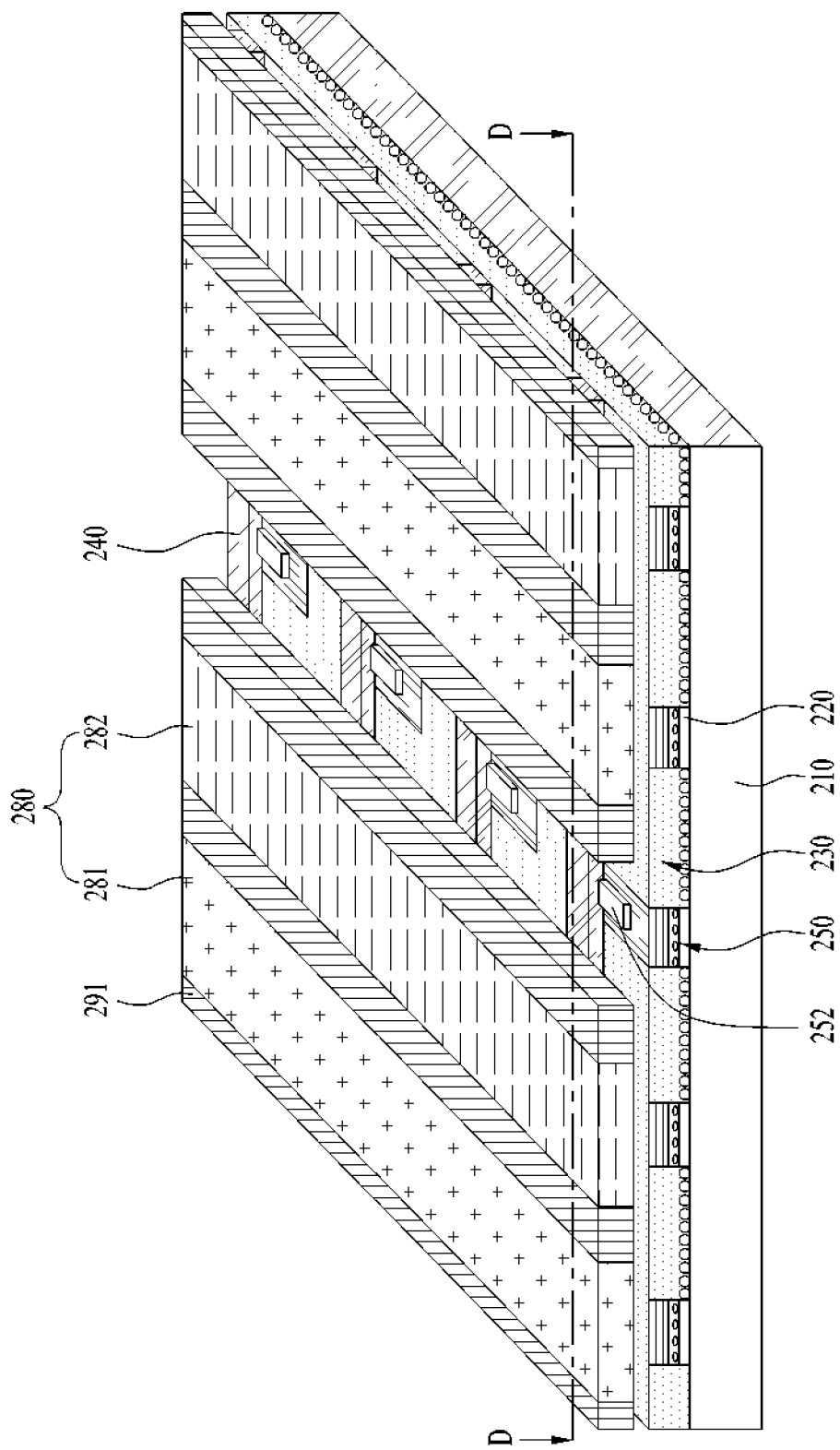
FIG. 7 is a perspective diagram of a display device using a semiconductor light emitting element according to another embodiment of the present disclosure.
Figure 8:
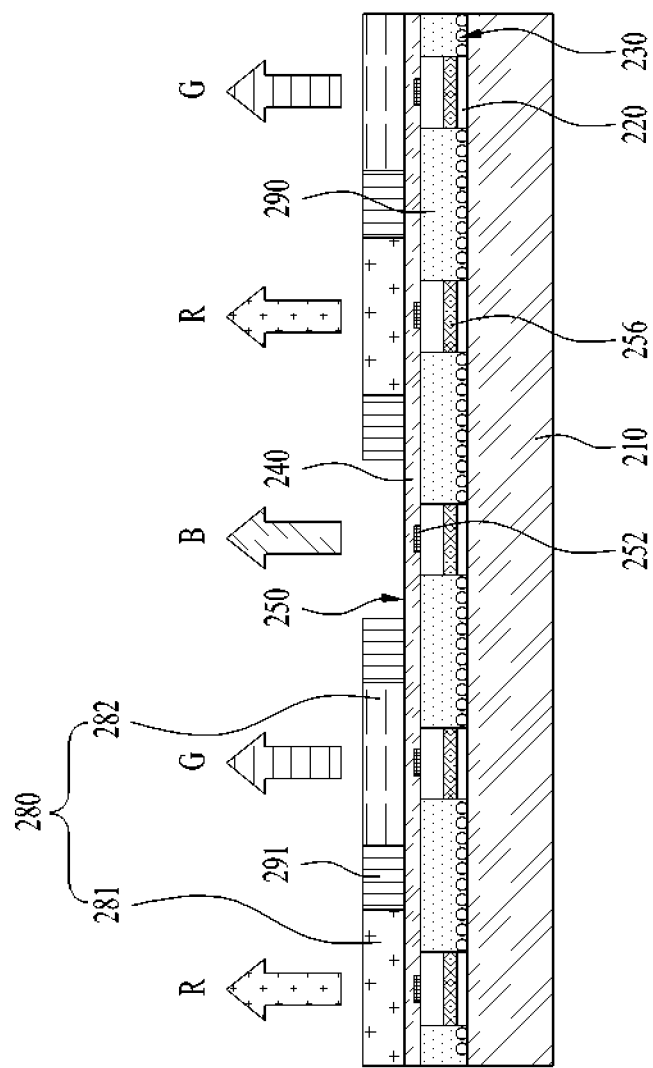
FIG. 8 is a cross-sectional diagram taken along a cutting line D-D shown in FIG. 7.
Figure 9:
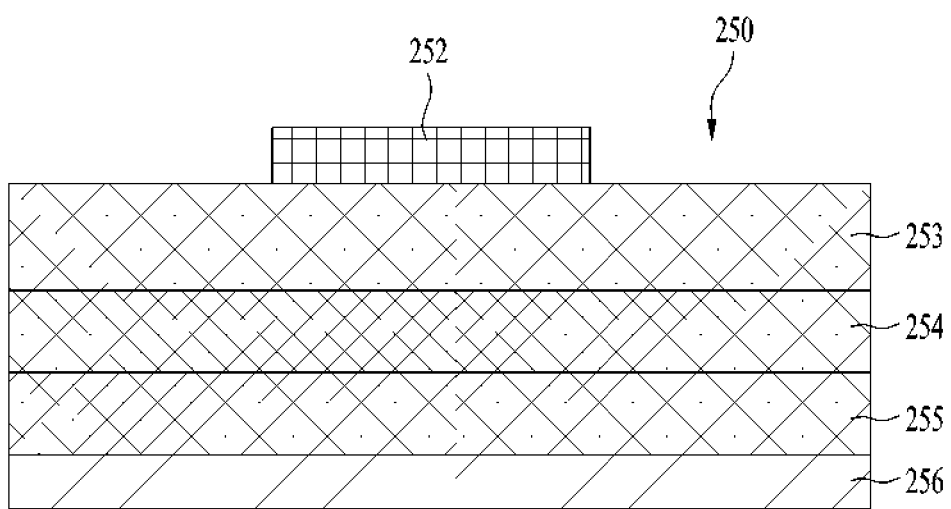
FIG. 9 is a conceptual diagram showing a vertical type semiconductor light emitting element shown in FIG. 8.

FIG. 7 is a perspective diagram of a display device using a semiconductor light emitting element according to another embodiment of the present disclosure, FIG. 8 is a cross-sectional diagram taken along a cutting line D-D shown in FIG. 7, and FIG. 9 is a conceptual diagram showing a vertical type semiconductor light emitting element shown in FIG. 8.

Referring to the present drawings, a display device may employ a vertical semiconductor light emitting device of a Passive Matrix (PM) type.

The display device includes a substrate 210, a first electrode 220, a conductive adhesive layer 230, a second electrode 240 and at least one semiconductor light emitting element 250.

The substrate 210 is a wiring substrate on which the first electrode 220 is disposed and may contain polyimide (PI) to implement a flexible display device. Besides, the substrate 210 may use any substance that is insulating and flexible.

The first electrode 210 is located on the substrate 210 and may be formed as a bar type electrode that is long in one direction. The first electrode 220 may be configured to play a role as a data electrode.

The conductive adhesive layer 230 is formed on the substrate 210 where the first electrode 220 is located. Like a display device to which a light emitting device of a flip chip type is applied, the conductive adhesive layer 230 may include one of an Anisotropic Conductive Film (ACF), an anisotropic conductive paste, a conductive particle contained solution and the like. Yet, in the present embodiment, a case of implementing the conductive adhesive layer 230 with the anisotropic conductive film is exemplified.

After the conductive adhesive layer has been placed in the state that the first electrode 220 is located on the substrate 210, if the semiconductor light emitting element 250 is connected by applying heat and pressure thereto, the semiconductor light emitting element 250 is electrically connected to the first electrode 220. In doing so, the semiconductor light emitting element 250 is preferably disposed to be located on the first electrode 220.

If heat and pressure is applied to an anisotropic conductive film, as described above, since the anisotropic conductive film has conductivity partially in a thickness direction, the electrical connection is established. Therefore, the anisotropic conductive film is partitioned into a conductive portion and a non-conductive portion.

Furthermore, since the anisotropic conductive film contains an adhesive component, the conductive adhesive layer 230 implements mechanical coupling between the semiconductor light emitting element 250 and the first electrode 220 as well as mechanical connection.

Thus, the semiconductor light emitting element 250 is located on the conductive adhesive layer 230, via which an individual pixel is configured in the display device. As the semiconductor light emitting element 250 has excellent luminance, an individual unit pixel may be configured in small size as well. Regarding a size of the individual semiconductor light emitting element 250, a length of one side may be equal to or smaller than 80 μm for example and the individual semiconductor light emitting element 250 may include a rectangular or square element. For example, the rectangular element may have a size equal to or smaller than 20 μm×80 μm.

The semiconductor light emitting element 250 may have a vertical structure.

Among the vertical type semiconductor light emitting elements, a plurality of second electrodes 240 respectively and electrically connected to the vertical type semiconductor light emitting elements 250 are located in a manner of being disposed in a direction crossing with a length direction of the first electrode 220.

Referring to FIG. 9, the vertical type semiconductor light emitting element 250 includes a p-type electrode 256, a p-type semiconductor layer 255 formed on the p-type electrode 256, an active layer 254 formed on the p-type semiconductor layer 255, an n-type semiconductor layer 253 formed on the active layer 254, and an n-type electrode 252 formed on then-type semiconductor layer 253. In this case, the p-type electrode 256 located on a bottom side may be electrically connected to the first electrode 220 by the conductive adhesive layer 230, and the n-type electrode 252 located on a top side may be electrically connected to a second electrode 240 described later. Since such a vertical type semiconductor light emitting element 250 can dispose the electrodes at top and bottom, it is considerably advantageous in reducing a chip size.

Referring to FIG. 8 again, a phosphor layer 280 may formed on one side of the semiconductor light emitting element 250. For example, the semiconductor light emitting element 250 may include a blue semiconductor light emitting element 251 emitting blue (B) light, and a phosphor layer 280 for converting the blue (B) light into a color of a unit pixel may be provided. In this regard, the phosphor layer 280 may include a red phosphor 281 and a green phosphor 282 configuring an individual pixel.

Namely, at a location of configuring a red unit pixel, the red phosphor 281 capable of converting blue light into red (R) light may be stacked on a blue semiconductor light emitting element. At a location of configuring a green unit pixel, the green phosphor 282 capable of converting blue light into green (G) light may be stacked on the blue semiconductor light emitting element. Moreover, the blue semiconductor light emitting element may be singly usable for a portion that configures a blue unit pixel. In this case, the unit pixels of red (R), green (G) and blue (B) may configure a single pixel.

Yet, the present disclosure is non-limited by the above description. In a display device to which a light emitting element of a flip chip type is applied, as described above, a different structure for implementing blue, red and green may be applicable.

Regarding the present embodiment again, the second electrode 240 is located between the semiconductor light emitting elements 250 and connected to the semiconductor light emitting elements electrically. For example, the semiconductor light emitting elements 250 are disposed in a plurality of columns, and the second electrode 240 may be located between the columns of the semiconductor light emitting elements 250.

Since a distance between the semiconductor light emitting elements 250 configuring the individual pixel is sufficiently long, the second electrode 240 may be located between the semiconductor light emitting elements 250.

The second electrode 240 may be formed as an electrode of a bar type that is long in one direction and disposed in a direction vertical to the first electrode.

In addition, the second electrode 240 and the semiconductor light emitting element 250 may be electrically connected to each other by a connecting electrode protruding from the second electrode 240. Particularly, the connecting electrode may include an n-type electrode of the semiconductor light emitting element 250. For example, the n-type electrode is formed as an ohmic electrode for ohmic contact, and the second electrode covers at least one portion of the ohmic electrode by printing or deposition. Thus, the second electrode 240 and the n-type electrode of the semiconductor light emitting element 250 may be electrically connected to each other.

Referring to FIG. 8 again, the second electrode 240 may be located on the conductive adhesive layer 230. In some cases, a transparent insulating layer (not shown) containing silicon oxide (SiOx) and the like may be formed on the substrate 210 having the semiconductor light emitting element 250 formed thereon. If the second electrode 240 is placed after the transparent insulating layer has been formed, the second electrode 240 is located on the transparent insulating layer. Alternatively, the second electrode 240 may be formed in a manner of being spaced apart from the conductive adhesive layer 230 or the transparent insulating layer.

If a transparent electrode of Indium Tin Oxide (ITO) or the like is sued to place the second electrode 240 on the semiconductor light emitting element 250, there is a problem that ITO substance has poor adhesiveness to an n-type semiconductor layer. Therefore, according to the present disclosure, as the second electrode 240 is placed between the semiconductor light emitting elements 250, it is advantageous in that a transparent electrode of ITO is not used. Thus, light extraction efficiency can be improved using a conductive substance having good adhesiveness to an n-type semiconductor layer as a horizontal electrode without restriction on transparent substance selection.

Referring to FIG. 8 again, a partition 290 may be located between the semiconductor light emitting elements 250. Namely, in order to isolate the semiconductor light emitting element 250 configuring the individual pixel, the partition 290 may be disposed between the vertical type semiconductor light emitting elements 250. In this case, the partition 290 may play a role in separating the individual unit pixels from each other and be formed with the conductive adhesive layer 230 as an integral part. For example, by inserting the semiconductor light emitting element 250 in an anisotropic conductive film, a base member of the anisotropic conductive film may form the partition.

In addition, if the base member of the anisotropic conductive film is black, the partition 290 may have reflective property as well as a contrast ratio may be increased, without a separate block insulator.

For another example, a reflective partition may be separately provided as the partition 190. The partition 290 may include a black or white insulator depending on the purpose of the display device.

In case that the second electrode 240 is located right onto the conductive adhesive layer 230 between the semiconductor light emitting elements 250, the partition 290 may be located between the vertical type semiconductor light emitting element 250 and the second electrode 240 each. Therefore, an individual unit pixel may be configured using the semiconductor light emitting element 250. Since a distance between the semiconductor light emitting elements 250 is sufficiently long, the second electrode 240 can be placed between the semiconductor light emitting elements 250. And, it may bring an effect of implementing a flexible display device having HD image quality.

In addition, as shown in FIG. 8, a black matrix 291 may be disposed between the respective phosphors for the contrast ratio improvement. Namely, the black matrix 291 may improve the contrast between light and shade.

Figure 10:
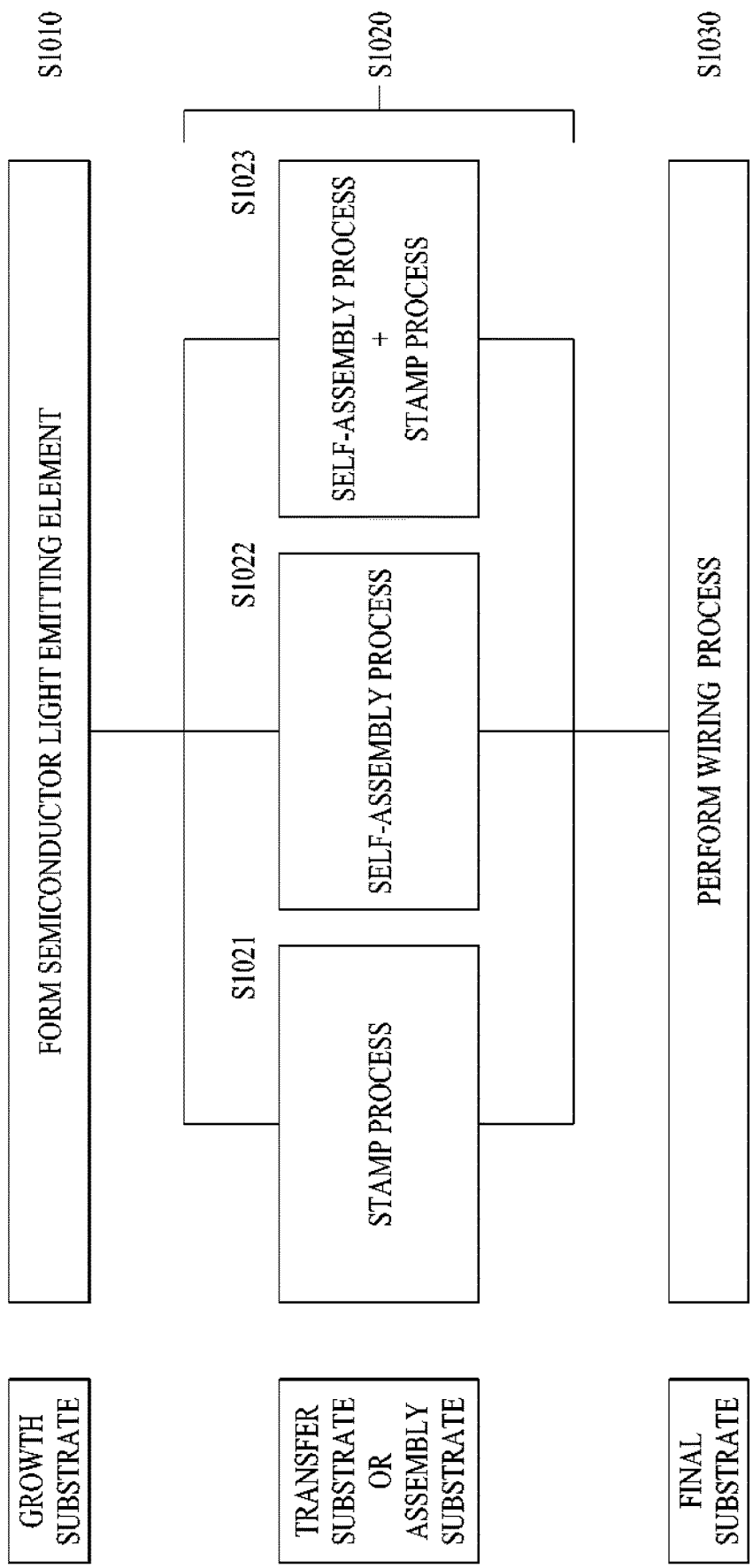
FIG. 10 is a diagram schematically illustrating a method for manufacturing a display device using a semiconductor light emitting element.

FIG. 10 is a diagram schematically illustrating a method for manufacturing a display device using a semiconductor light emitting element.

First, the semiconductor light emitting elements are formed on the growing substrate (S1010). The semiconductor light emitting elements may include a first conductivity type semiconductor layer, an active layer, and a second conductivity type semiconductor layer. In addition, a first conductivity type electrode formed on the first conductivity type semiconductor layer and a second conductivity type electrode formed on the second conductivity type semiconductor layer may be further included.

The semiconductor light emitting elements may be a horizontal type semiconductor light emitting element or the vertical type semiconductor light emitting element. However, in the case of the vertical type semiconductor light emitting element, because the first conductivity type electrode and the second conductivity type electrode face each other, a process of separating the semiconductor light emitting element from the growing substrate and forming a conductivity type electrode in one direction is added in a subsequent process. In addition, as will be described later, the semiconductor light emitting element may include a magnetic layer for a self-assembly process.

In order to utilize the semiconductor light emitting elements in the display device, in general, three types of semiconductor light emitting elements that emit light of colors corresponding to red (R), green (G), and blue (B) are required. Because semiconductor light emitting elements emitting light of one color are formed on one growing substrate, a separate substrate is required for the display device that implements individual unit pixels using the three types of semiconductor light emitting elements. Therefore, individual semiconductor light emitting elements must be separated from the growing substrate and assembled or transferred onto a final substrate. The final substrate is a substrate on which a process of forming a wiring electrode for applying a voltage to the semiconductor light emitting element such that the semiconductor light emitting element may emit light is performed.

Therefore, the semiconductor light emitting elements emitting the light of the respective colors may be transferred back to the final substrate after moving to the transfer substrate or the assembly substrate (S1020). In some cases, when performing the wiring process directly on the transfer substrate or the assembly substrate, the transfer substrate or the assembly substrate serves as the final substrate.

The method (S1020) for disposing the semiconductor light emitting element on the transfer substrate or the assembly substrate may be roughly divided into three types.

A first type is a method (S1021) for moving the semiconductor light emitting element from the growing substrate to the transfer substrate by the stamp process. The stamp process refers to a process of separating the semiconductor light emitting element from the growing substrate through a protrusion using a substrate that is made of a flexible material and having the adhesive protrusion. By adjusting a spacing and an arrangement of the protrusions, the semiconductor light emitting element of the growing substrate may be selectively separated.

A second type is a method (S1022) for assembling the semiconductor light emitting element onto the assembly substrate using the self-assembly process. For the self-assembly process, the semiconductor light emitting element must exist independently by being separated from the growing substrate, so that the semiconductor light emitting elements are separated from the growing substrate through a laser lift-off (LLO) process or the like as much as the required number of semiconductor light emitting elements. Thereafter, the semiconductor light emitting elements are dispersed in a fluid and assembled onto the assembly substrate using an electromagnetic field.

The self-assembly process may simultaneously assemble the semiconductor light emitting elements that respectively implement the R, G, and B colors on one assembly substrate, or assemble the semiconductor light emitting element of the individual color through an individual assembly substrate.

A third type is a method (S1023) for mixing the stamp process and the self-assembly process. First, the semiconductor light emitting elements are placed on the assembly substrate through the self-assembly process, and then the semiconductor light emitting elements are moved to the final substrate through the stamp process. In the case of the assembly substrate, because it is difficult to implement the assembly substrate in a large area due to a location of the assembly substrate during the self-assembly process, a contact with the fluid, an influence of the electromagnetic fields, or the like, a process of transferring the semiconductor light emitting elements to the final substrate of a large area after assembling the semiconductor light emitting elements using an assembly substrate of an appropriate area may be performed several times with the stamp process.

When a plurality of semiconductor light emitting elements constituting the individual unit pixel are placed on the final substrate, the wiring process for electrically connecting the semiconductor light emitting elements to each other is performed (S1030).

The wiring electrode formed through the wiring process electrically connects the semiconductor light emitting elements assembled or transferred onto the substrate to the substrate. In addition, a transistor for driving an active matrix may be previously formed beneath the substrate. Accordingly, the wiring electrode may be electrically connected to the transistor.

In one example, innumerable semiconductor light emitting elements are required for a large-area display device, so that the self-assembly process is preferable. In order to further improve an assembly speed, among the self-assembly processes, it may be preferred that the semiconductor light emitting elements of the respective colors are simultaneously assembled onto one assembly substrate. In addition, in order for the semiconductor light emitting elements of the respective colors to be assembled at predetermined specific positions on the assembly substrate, it may be required for the semiconductor light emitting elements to have a mutually exclusive structure.

Figure 11:
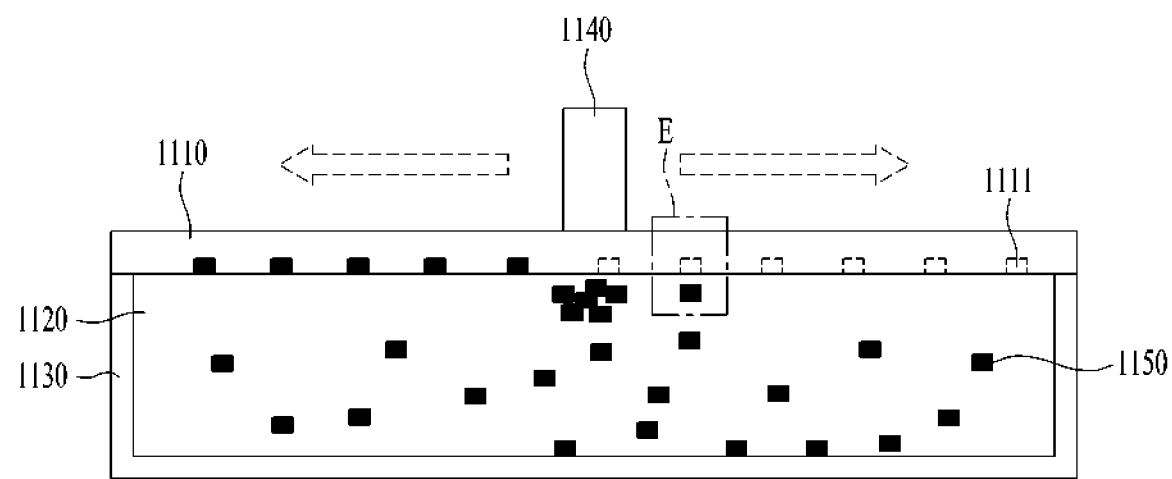
FIG. 11 is a diagram showing one embodiment of a method for assembling a semiconductor light emitting element onto a substrate by a self-assembly process.

FIG. 11 is a diagram showing one embodiment of a method for assembling a semiconductor light emitting element onto a substrate by a self-assembly process.

Figure 12:
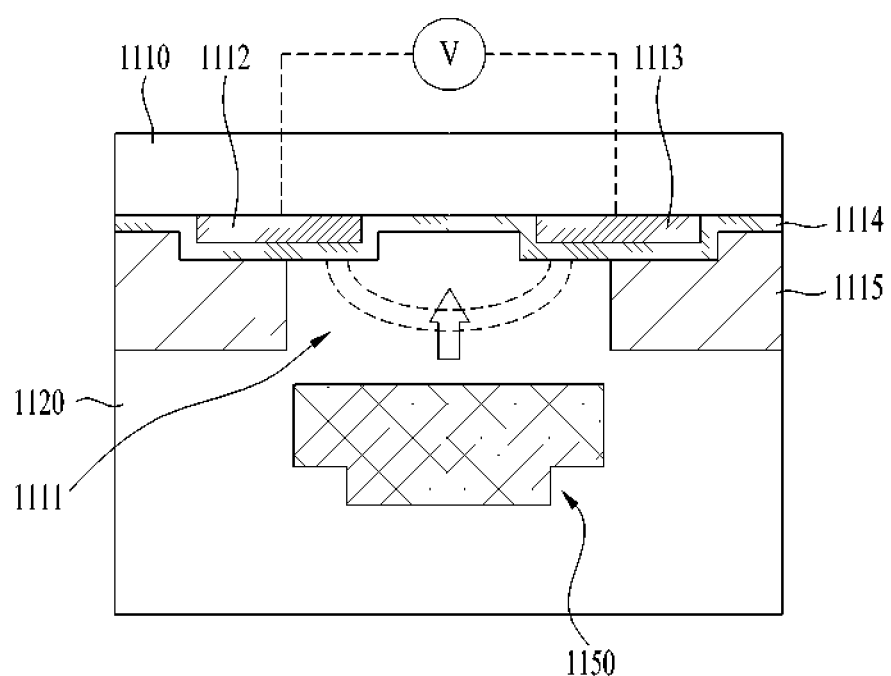
FIG. 12 is an enlarged view of a portion E in FIG. 11.

FIG. 12 is an enlarged view of a portion E in FIG. 11.

Referring to FIGS. 11 and 12, a semiconductor light emitting element 1150 may be input into a chamber 1130 filled with a fluid 1120.

Thereafter, the assembly substrate 1110 may be disposed on the chamber 1130. According to an embodiment, the assembly substrate 1110 may be introduced into the chamber 1130. In this regard, a direction in which the assembly substrate 1110 is introduced is a direction in which an assembly recess 1111 of the assembly substrate 1110 faces the fluid 1120.

A pair of electrodes 1112 and 1113 corresponding to each semiconductor light emitting element 1150 to be assembled may be formed on the assembly substrate 1110. The electrodes 1112 and 1113 may be implemented as transparent electrodes (ITO) or may be implemented using other common materials. The electrodes 1112 and 1113 correspond to assembly electrodes that stably fix the semiconductor light emitting element 1150 in contact with the assembly electrodes 1112 and 1113 by generating an electric field as a voltage is applied thereto.

Specifically, AC voltage may be applied to the electrodes 1112 and 1113, and the semiconductor light emitting element 1150 floating around the electrodes 1112 and 1113 may have polarities due to dielectric polarization. Further, the dielectrically polarized semiconductor light emitting element 1150 may be moved or fixed in a specific direction by a non-uniform electric field formed around the electrodes 1112 and 1113. This may be referred to as dielectrophoresis and, during the self-assembly process according to the present disclosure, the semiconductor light emitting element 1150 may be stably fixed to the assembly recess 1111 using dielectrophoresis.

Further, the distance between the assembly electrodes 1112 and 1113 may be less than, for example, the width of the semiconductor light emitting element 1150 and the diameter of the assembly recess 1111, and thus, the assembled position of the semiconductor light emitting element 1150 using an electric field may be more precisely fixed.

Further, an assembly insulating layer 1114 may be formed on the assembly electrodes 1112 and 1113, and may thus protect the electrodes 1112 and 1113 from the fluid 1120 and prevent leakage of current flowing in the assembly electrodes 1112 and 1113. For example, the assembly insulating layer 1114 may be formed as a single layer or multilayer structure using inorganic insulators, such as silica, alumina, etc., or organic insulators. In addition, the assembly insulating layer 1114 may have a minimum thickness so as to prevent damage to the assembly electrodes 1112 and 1113 when the semiconductor light emitting element 1150 is assembled with the assembly electrodes 1112 and 1113, and may have a maximum thickness so as to stably assemble the semiconductor light emitting element 1150.

A partition wall 1115 may be formed on the upper surface of the assembly insluting layer 1114. Some regions of the partition wall 1115 may be located on the assembly electrodes 1112 and 1113, and remaining regions may be located on the assembly substrate 1110.

For example, when the assembly substrate 1110 is manufactured, the assembly recesses 1111 through which the respective semiconductor light emitting elements 1150 are coupled to the assembly substrate 1110 may be formed by removing some parts of the partition wall 1115 formed on the entire upper surface of the assembly insulating layer 1114.

As shown in FIG. 12, the assembly recesses 1111 to which the semiconductor light emitting elements 1150 are coupled may be formed on the assembly substrate 1110, and the surface of the assembly substrate 1110 on which the assembly recesses 1111 are formed may come into contact with the fluid 1120. The assembly recesses 1111 may accurately guide the semiconductor light emitting elements 1150 to the assembly positions thereof.

Further, the partition wall 1115 may be formed to have a designated inclination in a direction from the opening of the assembly recess 1111 to the bottom surface of the assembly recess 1111. For example, through control of the inclination of the partition wall 1115, the assembly recess 1111 may have the opening and the bottom surface, and the area of the opening may be greater than the area of the bottom surface. Thereby, the semiconductor light emitting element 1150 may be assembled with the accurate position on the bottom surface in the assembly recess 1111.

Each of the assembly recesses 1111 may have a shape and a size corresponding to the shape of a corresponding one of the semiconductor light emitting elements 1150 assembled therewith. Accordingly, assembly of other semiconductor light emitting elements with the assembly recesses 1111 or assembly of a plurality of semiconductor light emitting elements with one assembly recess 1111 may be prevented.

Further, the depth of the assembly recesses 1111 may be less than the vertical height of the semiconductor light emitting elements 1150. Therefore, the semiconductor light emitting elements 1150 may protrude from the partition wall 1115, and may easily come into contact with protrusions of a transfer substrate during a transfer process after assembly.

Further, after the assembly substrate 1110 is disposed, as shown in FIG. 11, an assembly apparatus 1140 including a magnetic body may be moved along the assembly substrate 1110. The assembly apparatus 1140 may be moved in the state in which the assembly apparatus 1140 comes into contact with the assembly substrate 1110, so as to maximize a region, which a magnetic field affects, up to the inside of the fluid 1120. For example, the assembly apparatus 1140 may include a plurality of magnetic bodies, or may include a magnetic body having a size corresponding to the size of the assembly substrate 1110. In this case, the moving distance of the assembly apparatus 1140 may be restricted to within a designated range.

By the magnetic field generated by the assembly apparatus 1140, the semiconductor light emitting elements 1150 in the chamber 1110 may be moved towards the assembly apparatus 1140.

While the semiconductor light emitting elements 1150 are moved towards the assembly apparatus 1140, the semiconductor light emitting elements 1150 may enter the assembly recesses 1111, and may thus come into contact with the assembly substrate 1110, as shown in FIG. 12.

Further, the semiconductor light emitting elements 1150 may include a magnetic layer formed therein so as to perform the self-assembly process.

Due to the electric field generated by the assembly electrodes 1112 and 1113 of the assembly substrate 1110, release of the semiconductor light emitting elements 1150 coming into contact with the assembly substrate 1110 from the assembly substrate 1110 by movement of the assembly apparatus 1140 may be prevented.

Therefore, by the self-assembly method using an electromagnetic field, as shown in FIGS. 11 and 12, the plurality of semiconductor light emitting elements 1150 may be simultaneously assembled on the assembly substrate 1110.

Figure 13:
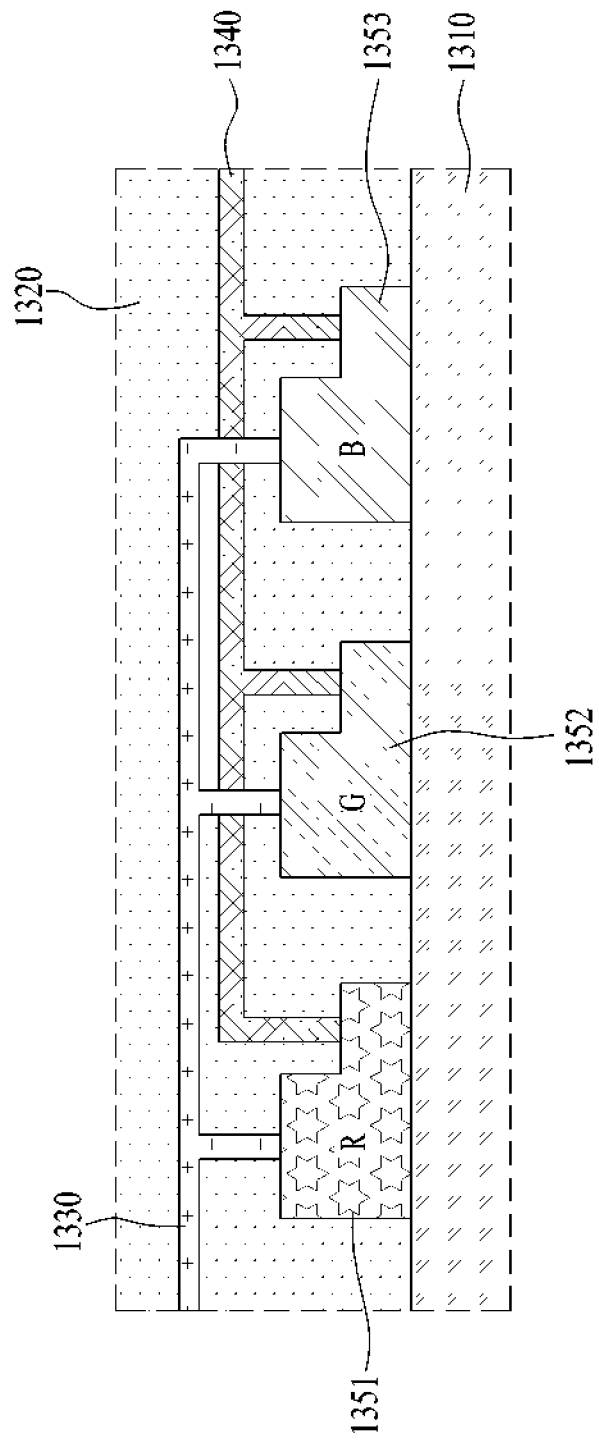
FIG. 13 is a diagram illustrating a unit pixel of a display device using a red semiconductor light emitting element according to the present disclosure.

FIG. 13 is a diagram illustrating a unit pixel of a display device using a red semiconductor light emitting element according to the present disclosure.

As shown in FIG. 13, a red (R) semiconductor light emitting element 1351, a green (G) semiconductor light emitting element 1352 and a blue (B) semiconductor light emitting element 1353 may be disposed on a substrate 1310. The respective semiconductor light emitting elements 1351, 1352 and 1353 may be horizontal type semiconductor light emitting elements configured such that conductivity-type electrodes are formed on one surface thereof. Further, the respective conductivity-type electrodes may be connected to wiring electrodes. For example, a first conductivity-type electrode connected to a first conductivity-type semiconductor layer may be electrically connected to a first wiring electrode 1330, and a second conductivity-type electrode connected to a second conductivity-type semiconductor layer may be electrically connected to a second wiring electrode 1340. Further, an interlayer insulating film 1320 may be formed between the semiconductor light emitting elements 1351, 1352 and 1353 and the wiring electrodes 1330 and 1340 so as to prevent unintended electrical connection between the elements.

Meanwhile, in order to apply the semiconductor light emitting elements 1351, 1352 and 1353 configured to emit light of various colors shown in FIG. 13 to a high-pixel display device, the respective semiconductor light emitting elements should be manufactured to have a size measured in micrometers. For example, a horizontal type semiconductor light emitting element may require a diameter of several tens of μm and a height of several μm, in consideration of the image quality level of display devices which are commercialized now. The height of the semiconductor light emitting element may be greater than the above-described value, i.e., several μm, but epitaxial growth for improving the height of the element takes high manufacturing costs and thus limit of the height of the element at the level of securing the luminous performance of the element may be required. On the other hand, when the height of the element is excessively low compared to the diameter of the element, the element may not emit light even when voltage is applied thereto, and therefore, the ratio of the height of the element to the diameter of the element should be adjusted to a proper level.

Further, each of the respective semiconductor light emitting elements may be formed on a corresponding growth substrate, and may be selectively transferred or separated from the growth substrate, thereby being capable of reducing manufacturing cost. For example, as described above with reference to FIG. 10, the transfer or separation method may use a stamp (or pick and place) process, the Laser Lift-Off (LLO) process, etc.

The green semiconductor light emitting element or the blue semiconductor light emitting element may be manufactured using a sapphire substrate as the growth substrate, but the red semiconductor light emitting element is manufactured using a GaAs substrate as the growth substrate. The reason for this is that, when epitaxial growth is performed on the GaAs substrate, a semiconductor light emitting element may have an energy band gap corresponding to red wavelengths. The sapphire substrate has light transmittance, and therefore, the green or blue semiconductor light emitting element may be formed on the sapphire substrate and then may be selectively separated therefrom through the LLO process. On the other hand, the GaAs substrate absorbs light and is thus optically opaque, and, in order to perform the LLO process for selective transfer of the element, an epitaxial layer formed on the GaAs substrate should be transferred onto a separate substrate formed of a light transmitting material like the sapphire substrate. For example, after the epitaxial layer for the red semiconductor light emitting element is first formed on the GaAs substrate, the epitaxial layer may be transferred to the substrate formed of the light transmitting material, and may then be etched to manufacture semiconductor light emitting elements. A bonding layer may be formed on the light transmitting substrate, and the epitaxial layer may be transferred from the GaAs substrate onto the light transmitting substrate due to a difference in adhesive force. In case of a horizontal type semiconductor light emitting element, the above transfer process may be repeated plural times so as to form conductivity-type electrodes only on one surface of the element. A detailed description thereof will be given below with reference to FIGS. 15 to 20.

The bonding layer may include benzocyclobutene (BCB) or UV resin. When BCB is used as the bonding layer, it may be easy to perform the transfer process due to high adhesive force of the bonding layer, but the bonding layer may remain on one surface of the element during the subsequent LLO process for separating the element.

Considering that the BCB layer having a thickness of several μm may remain on one surface of the element, in case of a semiconductor light emitting element having a diameter of several tens of μm, a problem may occur. As described above, the semiconductor light emitting element having a diameter of several tens of μm may have a height of several μm, and the thickness of the element may be additionally increased by several μm by the remaining BCB layer. Therefore, a large design error in the ratio of the height of the element to the diameter of the element may occur due to the remaining BCB layer. In order to reduce the design error, the thickness of the epitaxial layer should be reduced or the BCB layer should be removed in the operation of forming the element. However, the thickness of the epitaxial layer which is equal to or less than a proper level may reduce the luminous performance of the element, and may easily cause damage to the element during the process of transferring or separating the element. Therefore, removal of the bonding layer remaining on one surface of the semiconductor light emitting element is preferable. However, when chemical treatment is performed on the semiconductor light emitting element in order to remove the bonding layer, the conductivity-type semiconductor layers of the element may be damaged. Particularly, the red semiconductor light emitting element grown on the GaAs substrate is more breakable than other color semiconductor light emitting elements.

Therefore, the above-described problem may inevitably occur because the bonding layer is used to perform the transfer process of the red semiconductor light emitting element formed on the optically opaque GaAs substrate. Hereinafter, a red semiconductor light emitting element from which a bonding layer is removed so that the element is advantageous for miniaturization, and a method for manufacturing a display device using the same will be described with reference to FIGS. 14 to 20.

Figure 14:
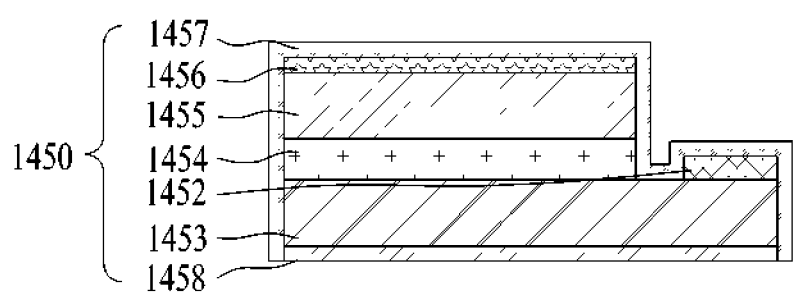
FIG. 14 is a diagram illustrating the structure of a red semiconductor light emitting element according to the present disclosure in detail.

FIG. 14 is a diagram illustrating the structure of a red semiconductor light emitting element according to the present disclosure in detail.

As shown in FIG. 14, an active layer 1454 and a first conductivity-type electrode 1452 may be located on a first conductivity-type semiconductor layer 1453. A second conductivity-type semiconductor layer 1455 may be located on the active layer 1454, and a second conductivity-type electrode 1456 may be located on the second conductivity-type semiconductor layer 1455. Further, the second conductivity-type electrode 1456 may be a transparent electrode layer formed of ITO, and may be located on the entire surface of the second conductivity-type semiconductor layer 1455. Further, a first passivation layer 1457 may be located so as to surround the upper and side surfaces of a semiconductor light emitting element 1450, and a second passivation layer 1458 may be located on the lower surface of the semiconductor light emitting element. In the present disclosure, the second passivation layer 1458 may be referred to as a release layer, and may serve as a protective film in a process of removing a remaining bonding layer inevitably occurring in the transfer process of a red semiconductor light emitting element. Further, although FIG. 14 illustrates the red semiconductor light emitting element formed as a horizontal type semiconductor light emitting element, the red semiconductor light emitting element may be formed as a vertical type semiconductor light emitting element. The present disclosure is technically characterized in that the remaining bonding layer is removed without damage to the red semiconductor light emitting element by forming the second passivation layer or the release layer on one surface of the element in a process of fabricating the element. Therefore, the present disclosure is not limited to a horizontal type or vertical type light emitting structure. For example, when the red semiconductor light emitting element is formed as a vertical type semiconductor light emitting element, a partial region of the second passivation layer 1458 may be open such that a first conductivity-type electrode is formed therein. However, in the description of the present disclosure, a horizontal type red semiconductor light emitting element having a plurality of conductivity-type electrodes formed on one surface thereof will be described as one embodiment.

Figure 15:
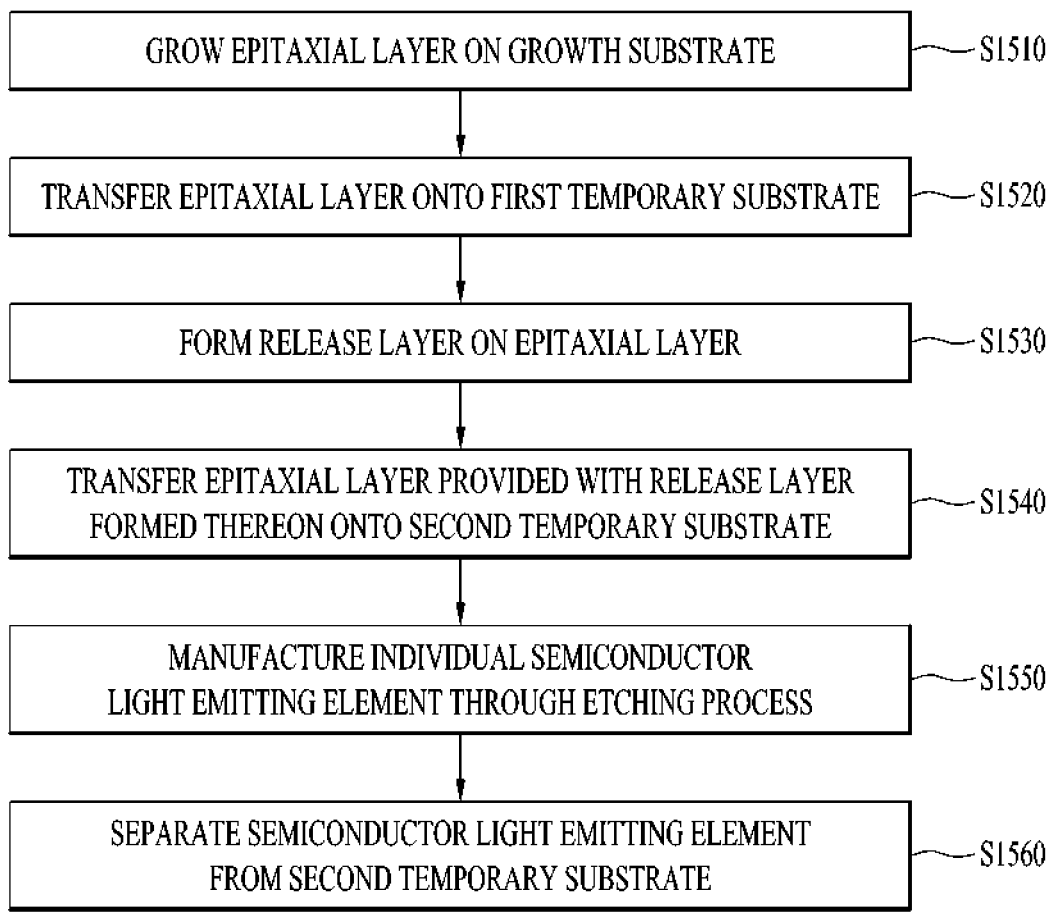
FIG. 15 is a flowchart representing a process of manufacturing a red semiconductor light emitting element according to the present disclosure.

FIG. 15 is a flowchart representing a process of manufacturing a red semiconductor light emitting element according to the present disclosure.

First, an epitaxial layer is formed on a growth substrate (S1510). The growth substrate may be a GaAs substrate for red semiconductor light emitting elements.

Thereafter, the epitaxial layer is transferred onto a first temporary substrate (S1520). A bonding layer may be formed in advance on the first temporary substrate, and the epitaxial layer may be transferred from the growth substrate onto the first temporary substrate due to the adhesive force of the bonding layer. The first temporary substrate may be a substrate having light transmittance, for example, a sapphire substrate. Using the sapphire substrate as the first temporary substrate, the bonding layer formed in advance on the sapphire substrate may be separated from the sapphire substrate through the LLO process by radiating a laser to the rear surface of the sapphire substrate.

Thereafter, a release layer is formed on the epitaxial layer (S1530). The release layer may be referred to as a second passivation layer configured to protect the lower surface of a semiconductor light emitting element which will be fabricated subsequently. Further, the release layer may serve as a protective layer which protects the element in the process of removing the remaining bonding layer inevitably occurring in the transfer process of the red semiconductor light emitting element.

Thereafter, the epitaxial layer provided with the release layer formed thereon is transferred onto the second temporary substrate (S1540). A bonding layer may be formed in advance on the second temporary substrate, and the operation of transferring the epitaxial layer (S1540) may include the LLO process. For example, the epitaxial layer may be separated from the first temporary substrate by bringing the epitaxial layer provided with the release layer formed thereon and the bonding layer of the second temporary substrate into contact with each other and then radiating a laser to the rear surface of the first temporary substrate. In this case, the release layer may be located on the lower surface of the epitaxial layer, and the remaining bonding layer of the first temporary substrate may be located on the upper surface of the epitaxial layer.

The remaining bonding layer may be removed through chemical etching, and a separate sacrificial layer or protective layer may be formed in advance on the upper surface of the epitaxial layer so as to prevent damage to the epitaxial layer due to etching.

Thereafter, individual semiconductor light emitting elements are manufactured through an etching process (S1550). Some regions of the release layer may be etched through the etching process.

Finally, the manufactured semiconductor light emitting element is separated from the second temporary substrate (S1560). The operation of separating the semiconductor light emitting element (S1560) may include the LLO process or a chemical etching process.

In the light of the purposes of the present disclosure, it will be readily apparent to those skilled in the art that omission or change of some operations represented in the flowchart shown in FIG. 15 should be construed as being within the scope of the present disclosure.

Figure 16:
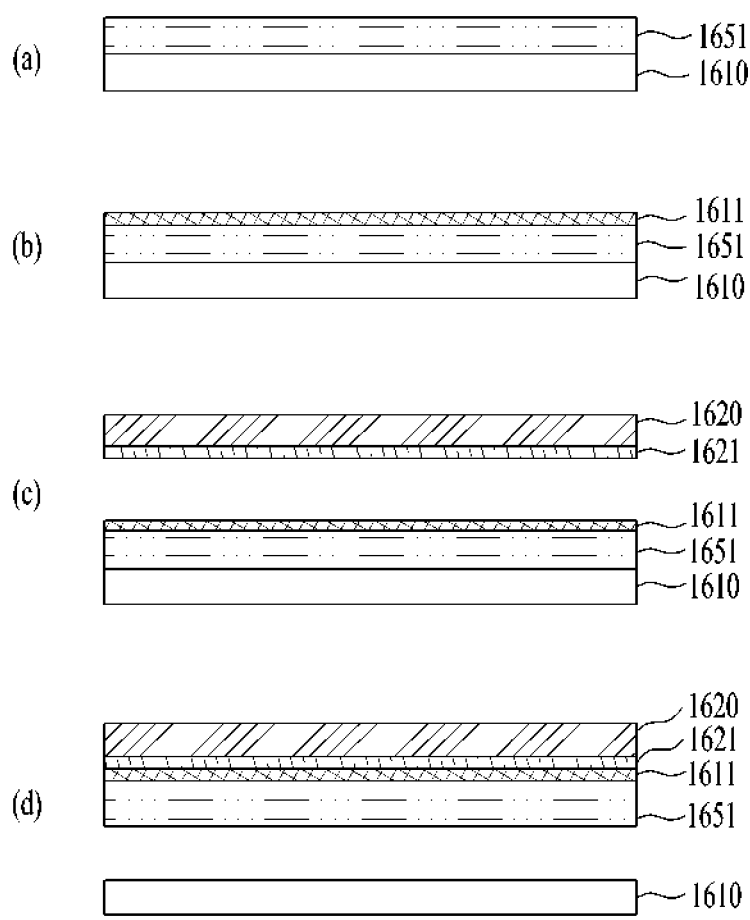
FIG. 16 shows cross-sectional diagrams illustrating a process of transferring an epitaxial layer on a growth substrate according to the present disclosure onto a first temporary substrate.

FIG. 16 shows cross-sectional diagrams illustrating a process of transferring an epitaxial layer on a growth substrate onto a first temporary substrate.

As shown in (a) of FIG. 16, an epitaxial layer 1651 is formed on a growth substrate 1610. Further, the epitaxial layer 1651 may include a first conductivity-type semiconductor layer, an active layer and a second conductivity-type semiconductor layer.

Thereafter, as shown in (b) of FIG. 16, a sacrificial layer 1611 is formed on the epitaxial layer 1651. The sacrificial layer 1611 serves to protect the epitaxial layer 1651 from a bonding layer on the first temporary substrate.

Thereafter, as shown in (c) of FIG. 16, a first temporary substrate 1620 provided with a bonding layer 1621 formed thereon is located so as to face the growth substrate 1610. Thereafter, when the bonding layer 1621 and the sacrificial layer 1611 are brought into contact with each other, the epitaxial layer 1651 may be transferred from the growth substrate 1610 onto the first temporary substrate 1620 due to a difference in adhesive force, as shown in (d) of FIG. 16. Therefore, the bonding layer 1621, the sacrificial layer 1611 and the epitaxial layer 1651 may be sequentially located on the first temporary substrate 1620.

Figure 17:
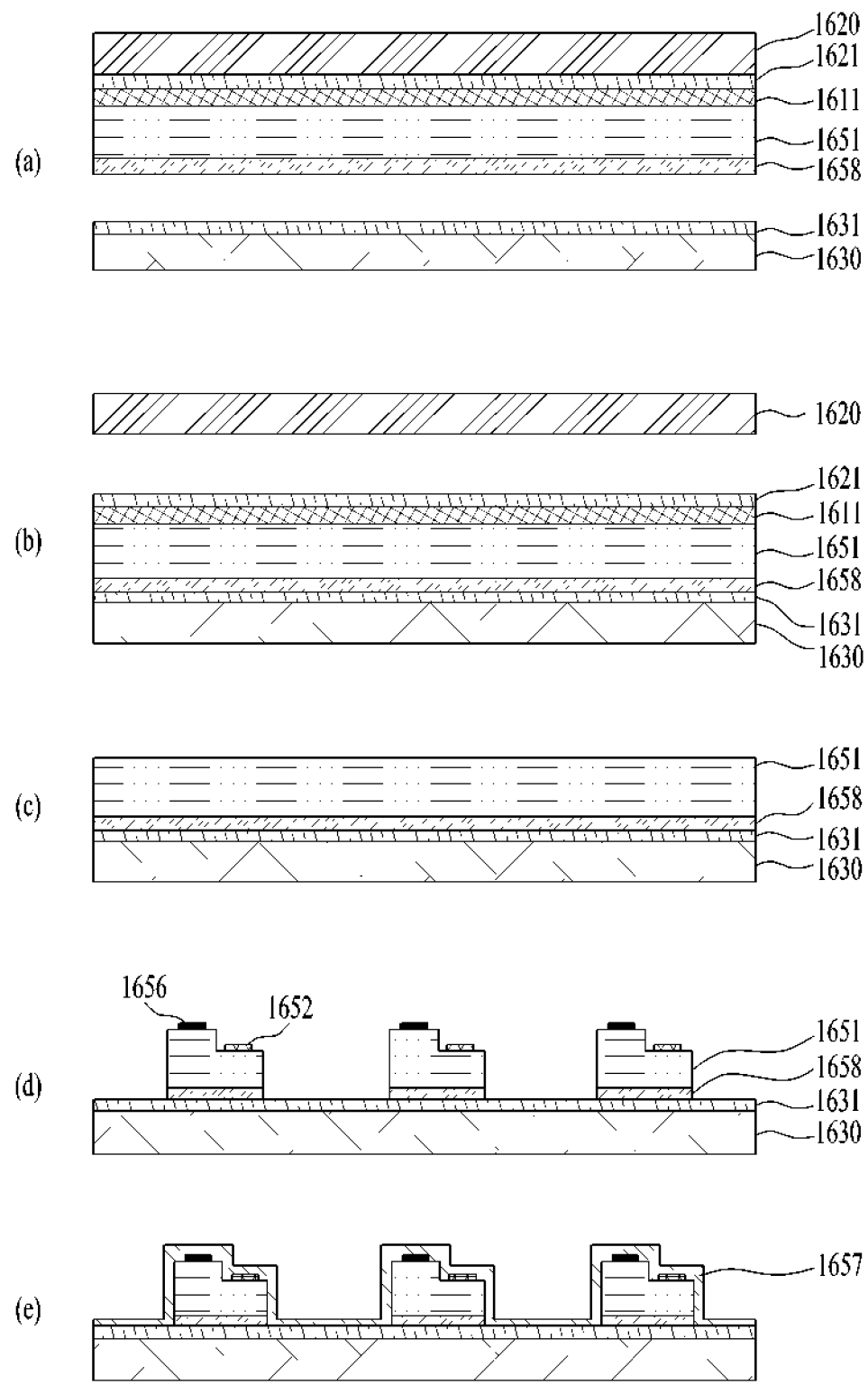
FIG. 17 shows cross-sectional diagrams illustrating a process of transferring the epitaxial layer on the first temporary substrate onto a second temporary substrate and thereafter manufacturing semiconductor light emitting elements through an etching process.

FIG. 17 shows cross-sectional diagrams illustrating a process of transferring the epitaxial layer on the first temporary substrate onto a second temporary substrate and thereafter manufacturing semiconductor light emitting elements through the etching process.

As shown in (a) of FIG. 17, a release layer 1658 is formed on the exposed surface of the epitaxial layer 1651 transferred onto the first temporary substrate 1620. The release layer 1658 may be an inorganic insulating layer or a metal layer. Otherwise, the release layer 1658 may have a structure in which a metal layer and an inorganic insulating layer are stacked. Further, it is easy to adjust the thickness of the release layer 1658 through deposition. For example, the thickness of the release layer 1658 may be adjusted within the range of 0.01 μm to 1 μm, so as to achieve the size of semiconductor light emitting elements, which is measured in micrometers.

A second temporary substrate 1630 may be located so as to face the epitaxial layer 1651 provided with the release layer 1658 formed thereon. A bonding layer 1631 may be formed on the upper surface of the second temporary substrate 1630, and the bonding layer 1631 may include a BCB material or UV resin having high adhesiveness.

In FIG. 17, (b) is a cross-sectional diagram after transfer of the epitaxial layer 1651 on the first temporary substrate 1620 onto the second temporary substrate 1630. As described above, the first temporary substrate 1620 may be formed of a light transmitting material, and thus, the bonding layer 1621 may be separated from the first temporary substrate 1620 by radiating a laser to the rear surface of the first temporary substrate 1620. When the epitaxial layer 1651 is transferred onto the second temporary substrate 1630, the bonding layer 1631 and the release layer 1658 may be located on the lower surface of the first epitaxial layer 1651, and the sacrificial layer 1611 and the bonding layer 1621 may be located on the upper surface of the epitaxial layer 1651. The bonding layer 1621 transferred from the first temporary substrate and the bonding layer 1631 formed on the second temporary substrate may be formed of the same material.

In FIG. 17, (c) is a cross-sectional diagram in which one surface of the epitaxial layer 1651 is exposed. The sacrificial layer 1611 and the bonding layer 1621 formed on the upper surface of the epitaxial layer 1651 may be simultaneously removed by etching the sacrificial layer. For example, when the sacrificial layer is formed of an oxide-based material, the sacrificial layer and the bonding layer may be simultaneously removed by dissolving oxides using hydrofluoric acid.

In FIG. 17, (d) is a cross-sectional diagram in which the epitaxial layer 1651 is transformed into individual semiconductor light emitting structures through the etching process and thereafter conductivity-type electrodes are formed on the semiconductor light emitting structures. As shown in (d) of FIG. 17, the epitaxial layer 1651 may form horizontal type semiconductor light emitting structures, and a first conductivity-type electrode 1652 and a second conductivity-type electrode 1656 may be located on each of the light emitting structures. Further, some regions of the release layer 1658 located on the lower surface of the epitaxial layer 1651 may also be etched so as to remain at the positions of the individual semiconductor light emitting structures.

In FIG. 17, (e) is a cross-sectional diagram after a first passivation layer 1657 is formed on the upper and side surfaces of the semiconductor light emitting elements. Further, the release layer is located on the lower surfaces of the semiconductor light emitting elements, and may thus serve as a passivation layer.

Figure 18:
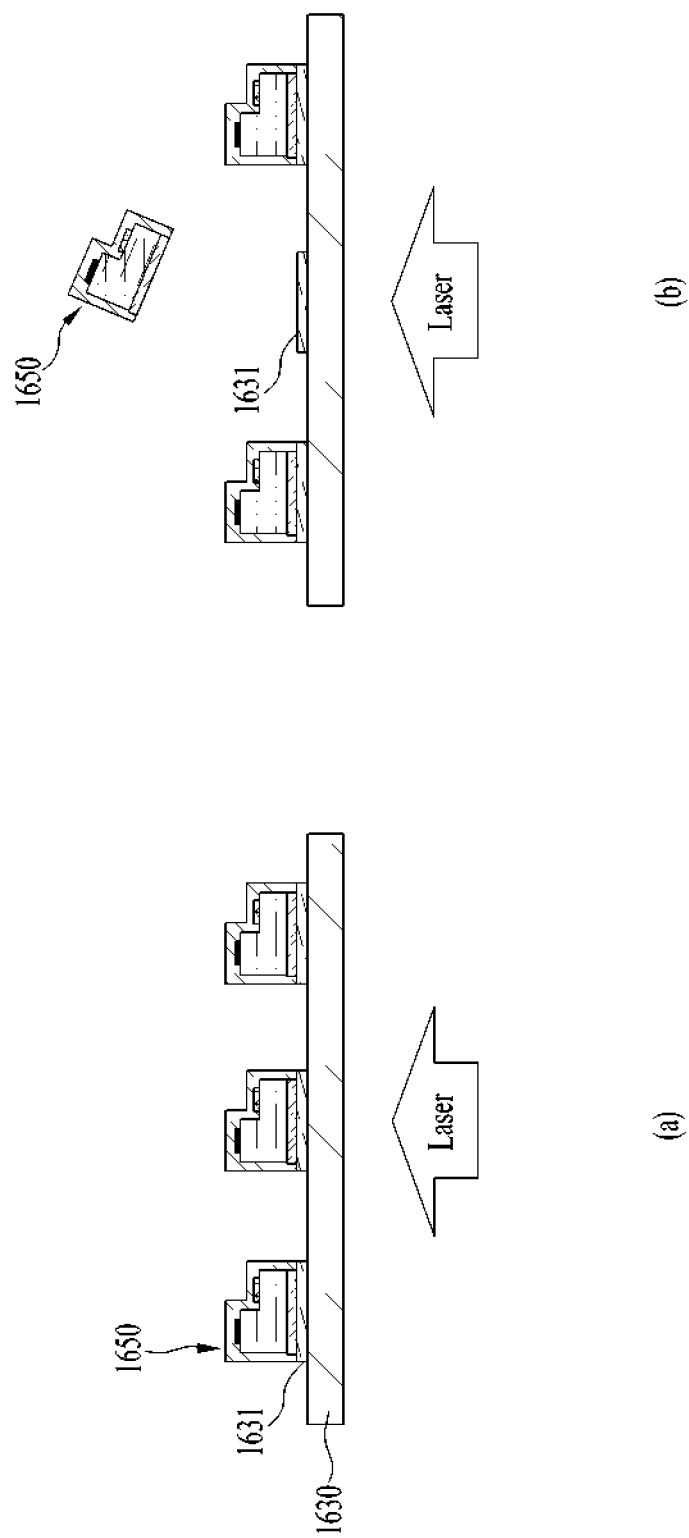
FIG. 18 shows cross-sectional diagrams illustrating a process of separating an individual semiconductor light emitting element using Laser Lift-Off.

FIG. 18 shows cross-sectional diagrams illustrating a process of separating an individual semiconductor light emitting element using Laser Lift-Off.

As shown in (a) FIG. 18, some regions of the bonding layer 1631 are additionally etched so as to remain under the individual semiconductor light emitting elements 1650, and thus, the bonding layer 1631 may be located only under the respective semiconductor light emitting elements 1650. Thereafter, a laser may be selectively radiated onto the semiconductor light emitting element desired to be separated from the second temporary substrate 1630 through the rear surface of the second temporary substrate 1630. Otherwise, the semiconductor light emitting elements 1650 may be separated at once from the second temporary substrate 1630 by radiating a laser to the entirety of the rear surface of the second temporary substrate 1630.

As shown in (b) of FIG. 18, the semiconductor light emitting elements 1650 may be individually separated from the temporary substrate and the bonding layer 1631 by radiating the laser. As will be described below, the release layer of the semiconductor light emitting element may be formed of a single material, or may be formed by stacking a plurality of materials. When the release layer is formed of a single material, a part of the bonding layer 1631 may remain under the lower surfaces of the semiconductor light emitting elements 1650. However, the remaining bonding layer may be entirely removed from the lower surface of each separated semiconductor light emitting element 1650 through chemical treatment. The semiconductor light emitting element 1650 may be protected from a chemical agent by the first passivation layer or the release layer (or a second passivation layer) during chemical treatment. Therefore, the release layer of the semiconductor light emitting element 1650 may allow the bonding layer to be stably removed, and thereby, the designed thickness of the semiconductor light emitting element may be maintained. Further, damage to or a defect of the semiconductor light emitting element, which may occur during the LLO process and the transfer process of the element, may be prevented.

Figure 19:
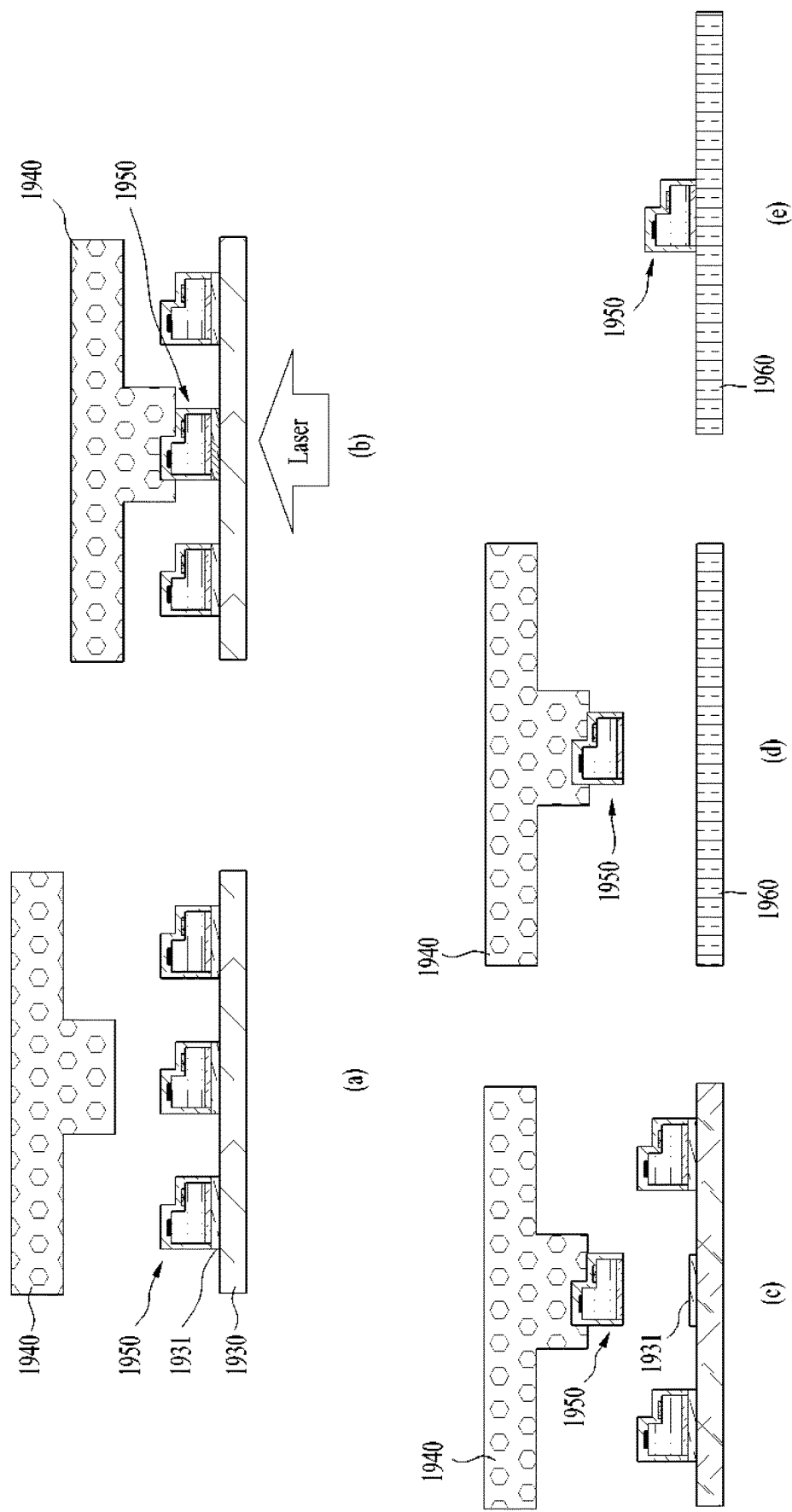
FIG. 19 shows cross-sectional diagrams illustrating a process of transferring a semiconductor light emitting element onto a wiring substrate using Laser Lift-Off and a transfer substrate.

FIG. 19 shows cross-sectional diagrams illustrating a process of transferring a semiconductor light emitting element onto a wiring substrate using the Laser Lift-Off (LLO) process and a transfer substrate.

First, as shown in (a) of FIG. 19, semiconductor light emitting elements 1950 are located on a bonding layer 1931 on a second temporary substrate 1930. A transfer substrate 1940 onto which the semiconductor light emitting element 1950 is transferred is located so as to face the second temporary substrate 1930. The transfer substrate 1940 may include an organic protrusion corresponding to the size of the semiconductor light emitting element 1950. Therefore, the organic protrusion may come into contact with the semiconductor light emitting element desired to be transferred.

For example, as shown in (b) of FIG. 19, the organic protrusion of the transfer substrate 1940 may come into contact with a specific semiconductor light emitting element 1950. Further, the LLO process may be added so as to separate the semiconductor light emitting element 1950 from the second temporary substrate. For example, a laser may be radiated to a region of the rear surface of the substrate in which the specific semiconductor light emitting element 1950 coming into contact with the transfer substrate 1940 is located, as shown in (b) of FIG. 19.

In the region to which the laser is radiated, the semiconductor light emitting element may be separated from the temporary substrate, and thus, the specific semiconductor light emitting element 1950 may be transferred onto the transfer substrate 1940, as shown in (c) of FIG. 19. Further, a part of the bonding layer 1931 located under the specific semiconductor light emitting element 1950 may be transferred together with the element, and, in this case, the bonding layer 1931 may be completely removed through additional chemical treatment. In the removal process, the semiconductor light emitting element may be protected by a passivation layer and a release layer, and thus, damage to the element may be minimized.

In FIG. 19, (d) is a diagram showing a process of transferring the semiconductor light emitting element 1950 transferred onto the transfer substrate 1940, as shown in (c) of FIG. 19, onto a wiring substrate 1960. A separate bonding layer may be formed on the upper surface of the wiring substrate 1960, and the semiconductor light emitting element 1950 may be transferred from the transfer substrate 1940 onto the wiring substrate 1960 due to a difference in adhesive force. Further, transistors configured to drive the active matrix of a display device may be formed in advance on the wiring substrate 1960.

Finally, (e) of FIG. 19 illustrates the semiconductor light emitting element 1950 which has been completely transferred onto the wiring substrate 1960. The semiconductor light emitting element 1950 may have the same structure as the semiconductor light emitting element described above with reference to FIG. 14, a first passivation layer may be located on the upper and side surfaces of the element 1950, and a release layer (or a second passivation layer) may be located on the lower surface of the element 1950.

Figure 20:
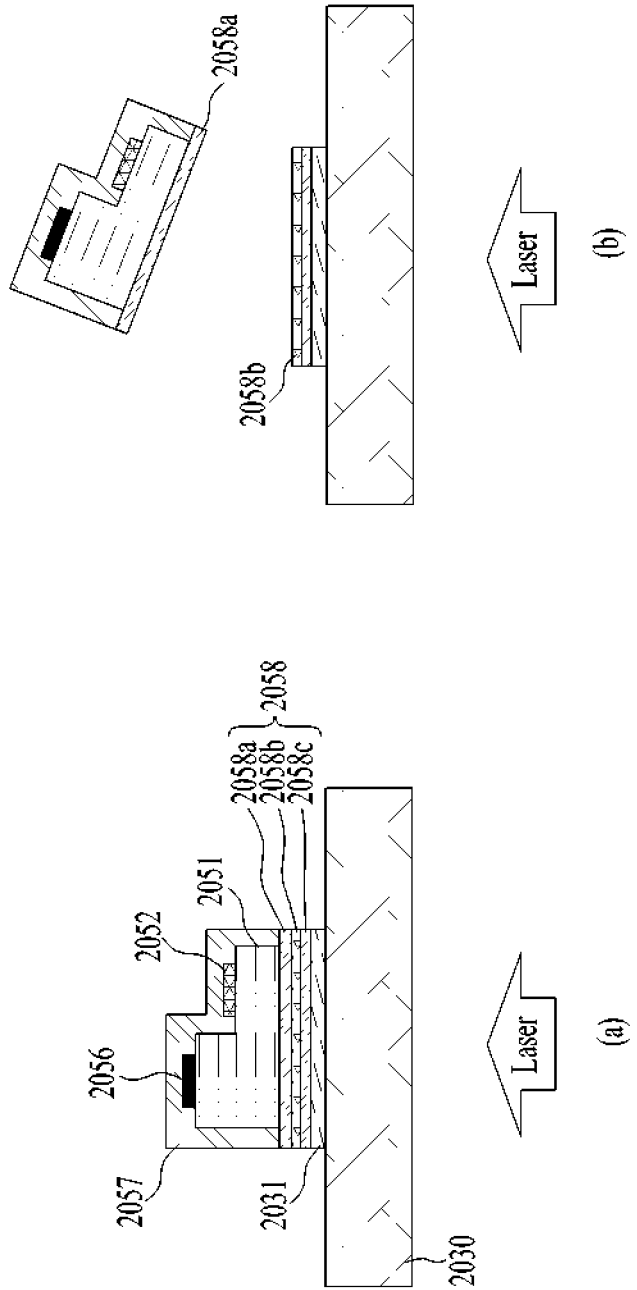
FIG. 20 shows cross-sectional diagrams illustrating a release layer and a process of separating a semiconductor light emitting element according to another embodiment of the present disclosure.

FIG. 20 shows cross-sectional diagrams illustrating a release layer and a process of separating a semiconductor light emitting element according to another embodiment of the present disclosure.

Referring to (a) of FIG. 20, a release layer 2058 may include a first metal layer 2058a, a second metal layer 2058c and an inorganic insulating layer 2058b. The inorganic insulating layer 2058b may be an oxide layer, and the oxide layer may be naturally formed through oxidation of the second metal layer 2058c. Therefore, as shown in (a) of FIG. 20, a semiconductor light emitting element located on a bonding layer 2031 on a second temporary substrate 2030 may include the release layer 2058 formed on the lower surface of the element, an epitaxial layer 2051, conductivity-type electrodes 2052 and 2056 formed on the upper surface of the element, and a passivation layer 2057 configured to surround the upper and side surfaces of the element. Further, in order to separate the semiconductor light emitting element from the second temporary substrate 2030, a laser may be radiated to the rear surface of the temporary substrate 2030.

In FIG. 20, (b) shows a process of separating the semiconductor light emitting layer from the second temporary substrate. When the laser is radiated to the rear surface of the second temporary substrate, energy corresponding to the laser may pass through the temporary substrate and may be absorbed by the bonding layer, and thereby, an interfacial change may occur in the bonding layer. When the release layer of a red semiconductor light emitting element according to the present disclosure includes a single layer, the semiconductor light emitting element is separated from the temporary substrate by the interfacial change in the bonding layer, and a part of the bonding layer may remain on the semiconductor light emitting element. However, in case of the release layer having a composite structure including the metal layers and the inorganic insulating layer, interfacial separation between the first metal layer 2058a and the inorganic insulating layer 2058b may occur. Therefore, the structure of the release layer 2058 shown in FIG. 20 may omit the chemical treatment process for removing the remaining bonding layer when the release layer includes a single layer. Further, when the metal layer is located on the lower surface of the semiconductor light emitting element, the metal layer may serve as a reflective film configured to reflect light emitted by the semiconductor light emitting element, and may thus improve light extraction efficiency of the semiconductor light emitting element.

The above description is merely illustrative of the technical idea of the present disclosure. Those of ordinary skill in the art to which the present disclosure pertains will be able to make various modifications and variations without departing from the essential characteristics of the present disclosure.

Therefore, embodiments disclosed in the present disclosure are not intended to limit the technical idea of the present disclosure, but to describe, and the scope of the technical idea of the present disclosure is not limited by such embodiments.

The scope of protection of the present disclosure should be interpreted by the claims below, and all technical ideas within the scope equivalent thereto should be construed as being within the scope of the present disclosure.

What is claimed is:

1. A method for manufacturing a display device comprising a plurality of semiconductor light emitting elements configured to emit light of different colors, the method comprising:
    forming an epitaxial layer configured to implement a semiconductor light emitting element on a growth substrate;
    transferring the epitaxial layer on the growth substrate onto a first temporary substrate;
    forming a release layer on the epitaxial layer transferred onto the first temporary substrate;
    transferring the epitaxial layer provided with the release layer formed thereon onto a second temporary substrate on which a bonding layer is formed;
    manufacturing the semiconductor light emitting element by etching the epitaxial layer transferred onto the second temporary substrate; and
    separating the semiconductor light emitting element from the second temporary substrate,
    wherein the separating the semiconductor light emitting element from the second temporary substrate further comprises:
        separating the bonding layer from the release layer by irradiating a laser to a bottom surface of the second temporary substrate; and
        removing a part of the bonding layer which remains on the release layer, and
    wherein the release layer is located on a lower surface of the separated semiconductor light emitting element.

2. The method of claim 1, further comprising, before separating the semiconductor light emitting element from the second temporary substrate, forming a passivation layer configured to surround upper and side surfaces of the semiconductor light emitting element.

3. The method of claim 1, wherein the transferring the epitaxial layer onto the second temporary substrate comprises bringing the bonding layer formed on the second temporary substrate into contact with the release layer.

4. The method of claim 3, wherein:
    the second temporary substrate is formed of a light transmitting material; and
    separating the semiconductor light emitting element from the second temporary substrate comprises a Laser Lift-Off (LLO) process.

5. The method of claim 1, wherein the release layer includes at least one of a metal layer and an inorganic insulating layer.

6. The method of claim 1, wherein the release layer has a thickness of 0.01 μm to 1 μm.

7. The method of claim 4, wherein:
    the release layer comprises a stack structure comprising a first metal layer, an oxide layer and a second metal layer; and
    separating the semiconductor light emitting element from the second temporary substrate comprises causing interfacial separation between the first metal layer and the oxide layer of the release layer.

8. The method of claim 1, wherein the manufacturing the semiconductor light emitting element comprises forming a plurality of conductivity-type electrodes on one surface of the etched epitaxial layer.

9. The method of claim 3, wherein the bonding layer comprises benzocyclobutene (BCB).

10. The method of claim 1, wherein the transferring the epitaxial layer onto the first temporary substrate comprises:
    forming a sacrificial layer on an upper surface of the epitaxial layer; and
    bringing a bonding layer formed on the first temporary substrate into contact with the sacrificial layer.

11. The method of claim 1, further comprising self-assembling the semiconductor light emitting element with an assembly substrate using an electric field and a magnetic field.

12. A display device comprising:
    a plurality of semiconductor light emitting elements configured to emit light of different colors; and
    a wiring substrate to accommodate the plurality of semiconductor light emitting elements, wherein, among the plurality of semiconductor light emitting elements, a semiconductor light emitting element configured to emit red light comprises:
    a first conductivity-type semiconductor layer;
    a second conductivity-type semiconductor layer located on the first conductivity-type semiconductor layer;
    an active layer disposed between the first conductivity-type semiconductor layer and the second conductivity-type semiconductor layer;
    a second conductivity-type electrode located on the second conductivity-type semiconductor layer;
    a first conductivity-type electrode located on an exposed region of the first conductivity-type semiconductor layer, formed by etching a part of each of the second conductivity-type semiconductor layer and the active layer;
    a first passivation layer configured to surround upper and side surfaces of the semiconductor light emitting element configured to emit red light; and
    a second passivation layer located on a lower surface of the semiconductor light emitting element,
wherein the second passivation layer is configured to protect the semiconductor light emitting element during removing of a remainder of a bonding layer.

13. The display device of claim 12, wherein the first passivation layer is an inorganic insulating layer, and the second passivation layer is a metal layer.

14. The display device of claim 12, wherein the semiconductor light emitting element includes a release layer on a lower surface of the semiconductor light emitting element.

15. The display device of claim 13, wherein the semiconductor light emitting elements are micro-LEDs having a size measured in micrometers.

16. The display device of claim 15, wherein the second passivation layer has a thickness of 0.01 μm to 1 μm.

17. The method of claim 1, wherein the semiconductor light emitting element is a red light emitting semiconductor light emitting element.

18. A display device comprising:
    a wiring substrate; and
    a plurality of semiconductor light emitting elements accommodated on the wiring substrate,
wherein, among the plurality of semiconductor light emitting elements, at least one semiconductor light emitting element comprises:
    a first conductivity-type semiconductor layer;
    a second conductivity-type semiconductor layer located on the first conductivity-type semiconductor layer;
    an active layer disposed between the first conductivity-type semiconductor layer and the second conductivity-type semiconductor layer;
    a first electrode including a first metal element and located on the first conductivity-type semiconductor layer;
    a second electrode including a second metal element and located on the second conductivity-type semiconductor layer;
    a third electrode including a metal element and located to face the first and the second electrodes so that the active layer is interposed between the third electrode and the first and second electrodes;
    a first passivation layer configured to surround upper and side surfaces of the at least one semiconductor light emitting element; and
    a second passivation layer located on a lower surface of the at least one semiconductor light emitting element,
wherein the second passivation layer includes at least one of the third electrode and an inorganic insulating layer, and the second passivation layer is configured to protect the at least one semiconductor light emitting element, and
wherein the second passivation layer is configured to protect the at least one semiconductor light emitting element during removing of a remainder of a bonding layer.

19. The display device of claim 18, wherein the first and second electrodes are each a transparent electrode.

20. The display device of claim 18, wherein the at least one semiconductor light emitting element includes a release layer on a lower surface of the at least one semiconductor light emitting element.

* * * * *